United States Patent
Nakagawa et al.

(10) Patent No.: US 11,133,773 B2
(45) Date of Patent: Sep. 28, 2021

(54) ELECTRONIC DEVICE, CONTROL SYSTEM FOR POWER CONVERSION DEVICE, MACHINE LEARNING DEVICE, AND METHOD OF CONTROLLING COOLING FAN

(71) Applicant: Mitsubishi Electric Corporation, Tokyo (JP)

(72) Inventors: Shinya Nakagawa, Tokyo (JP); Shizuri Tamura, Tokyo (JP); Ryuichi Takezawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 63 days.

(21) Appl. No.: 16/500,820

(22) PCT Filed: Apr. 6, 2018

(86) PCT No.: PCT/JP2018/014794
§ 371 (c)(1),
(2) Date: Oct. 4, 2019

(87) PCT Pub. No.: WO2018/190275
PCT Pub. Date: Oct. 18, 2018

(65) Prior Publication Data
US 2020/0403554 A1    Dec. 24, 2020

(30) Foreign Application Priority Data
Apr. 13, 2017 (WO) .................. PCT/JP2017/015198

(51) Int. Cl.
*H02P 29/68*    (2016.01)
*G06N 20/00*    (2019.01)

(52) U.S. Cl.
CPC ............. *H02P 29/68* (2016.02); *G06N 20/00* (2019.01)

(58) Field of Classification Search
CPC ................................ H02P 29/68; G06N 20/00
See application file for complete search history.

(56) References Cited

U.S. PATENT DOCUMENTS

| 2007/0150236 A1 | 6/2007 | Warizaya |
| 2009/0024252 A1 | 1/2009 | Aridome et al. |

(Continued)

FOREIGN PATENT DOCUMENTS

| CN | 104047880 A | 9/2014 |
| JP | 3203395 A | 9/1991 |

(Continued)

OTHER PUBLICATIONS

International Search Report and Written Opinion dated Jun. 19, 2018 for PCT/JP2018/014794 filed on Apr. 6, 2018, 8 pages including English Translation of the International Search Report.
Decision to Grant to Patent dated Feb. 6, 2019 for Japanese Patent Application No. 2018-564435 filed on Apr. 6, 2018, 5 pages including English Translation of the Decision to Grant to Patent.

(Continued)

*Primary Examiner* — Kawing Chan
*Assistant Examiner* — Bradley R Brown
(74) *Attorney, Agent, or Firm* — Xsensus LLP

(57) ABSTRACT

A power conversion device includes a cooling fan, a cooling fan control unit that controls the drive amount of the cooling fan, and an electrolytic capacitor whose life varies according to the drive amount of the cooling fan. The cooling fan control unit controls the drive amount based on the relationship between the drive amount, the life of the cooling fan, and the life of the electrolytic capacitor.

19 Claims, 15 Drawing Sheets

(56) References Cited

U.S. PATENT DOCUMENTS

| | | | |
|---|---|---|---|
| 2014/0265976 A1* | 9/2014 | Weiss | H02P 31/00 |
| | | | 318/471 |
| 2017/0091672 A1 | 3/2017 | Sasaki | |
| 2017/0117841 A1 | 4/2017 | Watanabe et al. | |

FOREIGN PATENT DOCUMENTS

| | | |
|---|---|---|
| JP | 6-233553 A | 8/1994 |
| JP | 11356036 A | 12/1999 |
| JP | 2007-199052 A | 8/2007 |
| JP | 2008-249934 A | 10/2008 |
| JP | 2015-133882 A | 7/2015 |
| JP | 2015-133882 A | 8/2015 |
| JP | 2015-225947 A | 12/2015 |
| JP | 6010204 B1 | 10/2016 |
| JP | 2017-070125 A | 4/2017 |
| KR | 10-1050487 B1 | 7/2011 |

OTHER PUBLICATIONS

Indian Office Action dated Jul. 27, 2020 in Indian patent application No. 201927040230.
Office Action dated Aug. 25, 2020 in German Patent Application No. 11 2018 001 154.2, 9 pages.
Office Action dated Jun. 5, 2020 in Chinese Patent Application No. 201880023777.6, 26 pages.
Office Action dated Dec. 10, 2020, in corresponding Chinese patent Application No. 201880023777.6, 18 pages.

\* cited by examiner

ELECTRONIC DEVICE, CONTROL SYSTEM FOR POWER CONVERSION DEVICE, MACHINE LEARNING DEVICE, AND METHOD OF CONTROLLING COOLING FAN

CROSS-REFERENCE TO RELATED APPLICATIONS

The present application is based on PCT filing PCT/JP2018/014794, filed Apr. 6, 2018, which claims priority to PCT/JP2017/015198, filed Apr. 13, 2017, the entire contents of each are incorporated herein by reference.

FIELD

The present invention relates to a power conversion device and an electronic device having a life diagnosis function, a control system for a power conversion device, a machine learning device, and a method of controlling a cooling fan mounted on a power conversion device.

BACKGROUND

A power conversion device is equipped with components such as a cooling fan or an electrolytic capacitor. Since these components need to be replaced, efforts have been made so far to predict the lives of these components to enable replacement before failure.

Patent Literature 1 below discloses a technique of predicting the life of a cooling fan from the temperature detected by a temperature detection unit and the relationship between the ambient temperature and the life written in advance to a memory based on the principle that the life of the cooling fan is determined by the ambient temperature. Similarly, Patent Literature 2 below discloses a technique of predicting the life of a main circuit electrolytic capacitor.

CITATION LIST

Patent Literature

Patent Literature 1: Japanese Patent Application Laid-open No. H3-203395
Patent Literature 2: Japanese Patent Application Laid-open No. H11-356036

SUMMARY

Technical Problem

The ambient temperature in a power conversion device varies according to the drive amount of the cooling fan in the power conversion device. The lives of the cooling fan and the electrolytic capacitor vary according to the ambient temperature. Therefore, the life of the cooling fan and the life of the electrolytic capacitor vary according to the drive amount, i.e. rotational speed, of the cooling fan.

The techniques of Patent Literature 1 and Patent Literature 2 are capable of predicting the life of the cooling fan or the electrolytic capacitor but incapable of controlling the life of the cooling fan and the life of the electrolytic capacitor based on the drive amount of the cooling fan.

In recent years, the demand for preventive maintenance has created a need for techniques of controlling the lives of components such as an electrolytic capacitor and a cooling fan.

The present invention has been made in view of the above, and an object thereof is to obtain a power conversion device capable of controlling the life of a component.

Solution to Problem

In order to solve the above problem and achieve the object, a power conversion device according to the present invention includes a first component, a control unit that controls the drive amount of the first component, and a second component whose life varies according to the drive amount of the first component. The control unit controls the drive amount based on the relationship between the drive amount, the life of the first component, and the life of the second component.

Advantageous Effects of Invention

The present invention can achieve the effect of controlling the life of a component of a power conversion device.

DESCRIPTION OF EMBODIMENTS

Hereinafter, a power conversion device according to embodiments of the present invention will be described in detail based on the drawings. The present invention is not limited to the following embodiments.

First Embodiment

Figure 1:
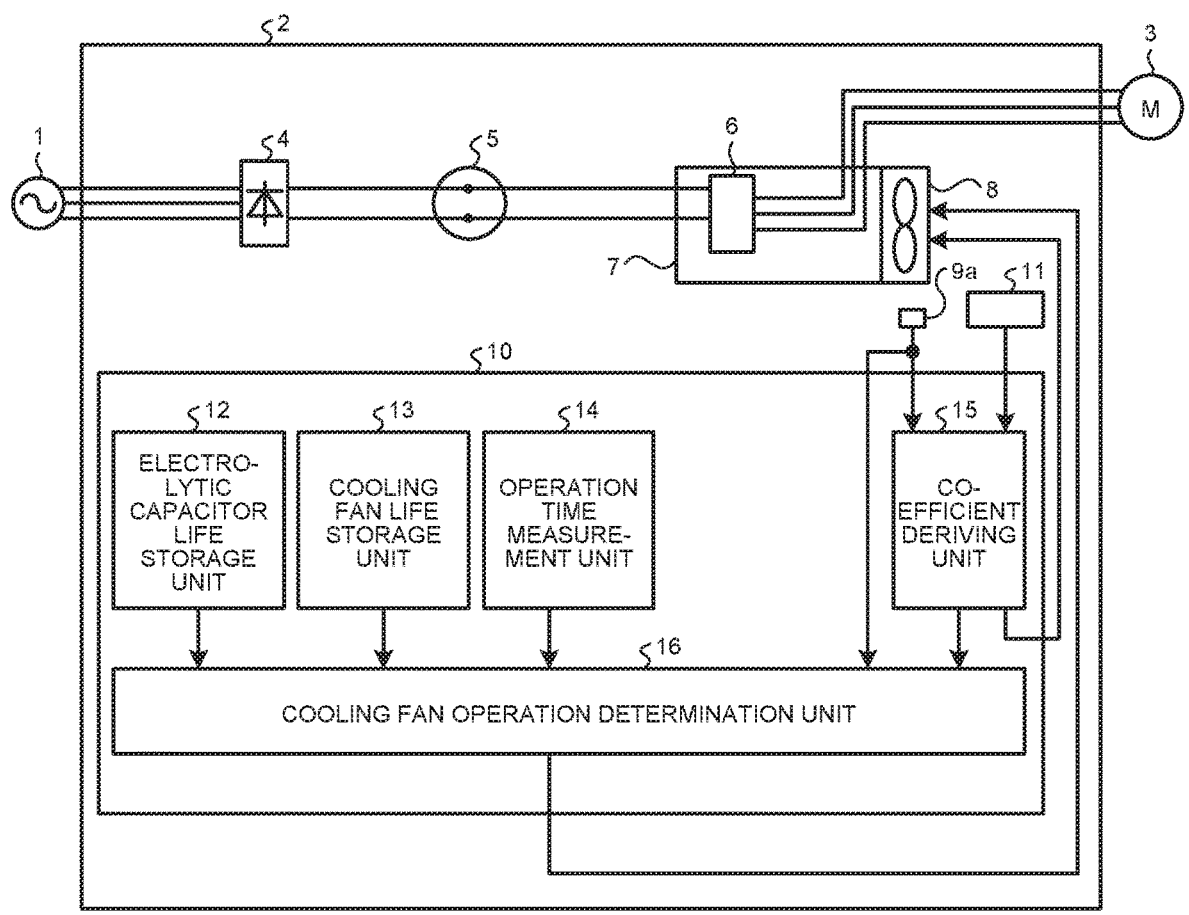
FIG. 1 is a block diagram illustrating an exemplary configuration of a power conversion device according to a first embodiment.

FIG. 1 is a block diagram illustrating an exemplary configuration of a power conversion device according to the first embodiment. FIG. 1 depicts the configuration of a power conversion device 2 connected to an AC power source 1 and configured to convert AC power from the AC power source 1 into DC power to drive a motor 3. It goes without saying that a power conversion device that converts DC power into AC power may be used.

The power conversion device 2 includes a rectifier circuit 4 for converting AC to DC, an electrolytic capacitor 5 for smoothing, a power module 6 for converting DC to AC, a heat sink 7 for cooling the power module 6, a cooling fan 8 for cooling the electrolytic capacitor 5 and the heat sink 7, a temperature sensor 9a that is a first temperature sensor for measuring the temperature of the area around the electrolytic capacitor 5 and the cooling fan 8, a cooling fan control unit 10 for determining the operation of the cooling fan 8, and an operation panel 11 that is an interface for communication with the cooling fan control unit 10. The cooling fan 8 is an example of a first component of the power conversion device 2, and the electrolytic capacitor 5 is an example of a second component of the power conversion device 2. The temperature sensor 9a is one of the sensors provided in the power conversion device 2. The cooling fan control unit 10 determines the operation of the cooling fan 8 in consideration of the lives of the electrolytic capacitor 5 and the cooling fan 8. That is, the cooling fan control unit 10 constitutes a life control unit in the first embodiment. A signal output by the cooling fan control unit 10 to the cooling fan 8 is a drive signal for driving the cooling fan 8.

The power conversion device 2 converts AC input from the AC power source 1 into DC using the rectifier circuit 4, generates AC of variable frequency from the converted DC, and applies the generated AC to the motor 3.

The cooling fan control unit 10 includes an electrolytic capacitor life storage unit 12, a cooling fan life storage unit 13, an operation time measurement unit 14, a coefficient deriving unit 15, and a cooling fan operation determination unit 16. Note that the components of the cooling fan control unit 10 in FIG. 1 are for descriptive purposes only, and each unit may be provided either inside or outside the cooling fan control unit 10.

The electrolytic capacitor life storage unit 12 outputs, to the cooling fan operation determination unit 16, the relationship between an ambient temperature Ta and a life Lsc of the electrolytic capacitor 5 whose operation time is zero, that is, the unused electrolytic capacitor 5. Hereinafter, when the operation time is zero, it is referred to as the "operation time 0". Here, the ambient temperature Ta is the temperature of the area around the cooling fan 8, and may be, for example, the temperature inside the housing of the power conversion device 2. Alternatively, the ambient temperature Ta may be the temperature of the area around the power conversion device 2 installed.

Figure 2:
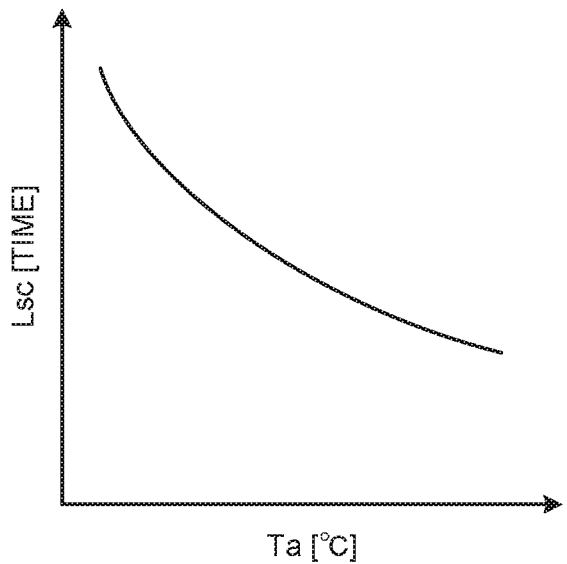
FIG. 2 is a diagram illustrating an example of the relationship between the ambient temperature Ta and the life Lsc (Ta) of an electrolytic capacitor at the operation time 0.

FIG. 2 is a diagram illustrating an example of the relationship between the ambient temperature Ta of the cooling fan 8 and the life Lsc of the electrolytic capacitor 5 at the operation time 0. The relationship between the ambient temperature Ta and the life Lsc is written in advance to the electrolytic capacitor life storage unit 12 or a non-volatile memory (not illustrated in FIG. 1). Information indicating the relationship between the ambient temperature Ta and the life Lsc can be obtained from the manufacturer of the electrolytic capacitor or obtained by using public information such as the Internet or a catalog. Hereinafter, the relationship between the ambient temperature Ta and the life Lsc is appropriately referred to as "Lsc (Ta)".

The cooling fan life storage unit 13 outputs, to the cooling fan operation determination unit 16, the relationship between the ambient temperature Ta and a life Lsf of the cooling fan 8 at the operation time 0 in the case that the rotational speed of the cooling fan 8 is N. Here, the rotational speed of the cooling fan 8 refers to the number of times the cooling fan 8 rotates per unit time.

Figure 3:
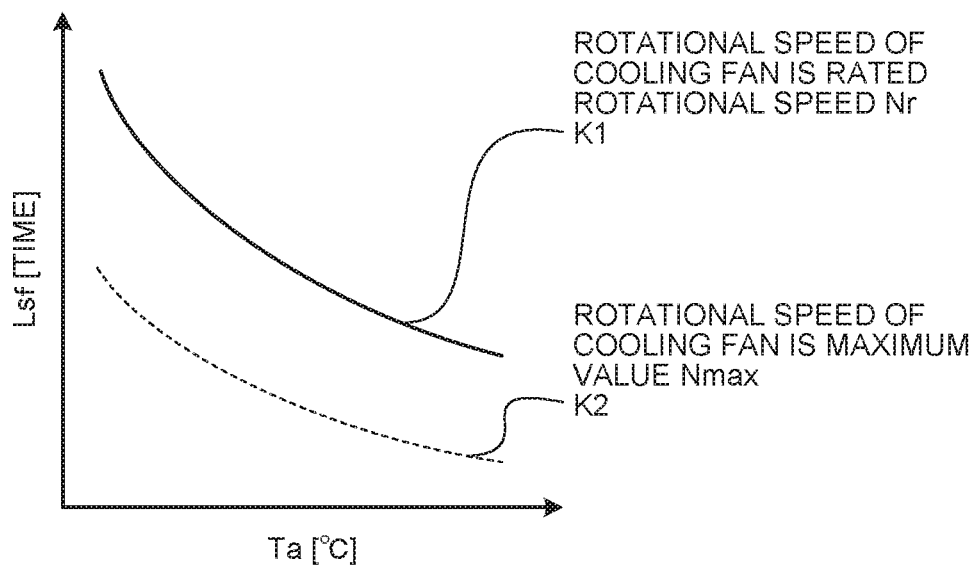
FIG. 3 is a diagram illustrating an example of the relationship between the ambient temperature Ta and the life Lsf (Ta, N) of a cooling fan at the operation time 0.

FIG. 3 is a diagram illustrating an example of the relationship between the ambient temperature Ta of the cooling fan 8 and the life Lsf of the cooling fan 8 at the operation time 0. The life Lsf of the cooling fan 8 depends not only on the ambient temperature Ta but also on the rotational speed N of the cooling fan 8. Therefore, data on the life of the cooling fan 8 at a plurality of rotational speeds N are written to the cooling fan life storage unit 13 or a non-volatile memory (not illustrated in FIG. 1). Information indicating the relationship between the ambient temperature Ta, the rotational speed N of the cooling fan 8, and the life Lsf of the cooling fan 8 at the operation time 0 can be obtained from the manufacturer of the cooling fan or obtained by using public information such as the Internet or a catalog. Hereinafter, the relationship between the ambient temperature Ta, the rotational speed N of the cooling fan 8, and the life Lsf of the cooling fan 8 at the operation time 0 is appropriately referred to as "Lsf (Ta, N)".

FIG. 3 depicts an example of life data obtained when the cooling fan 8 is driven at two different rotational speeds. Specifically, a solid curve K1 indicates the life-temperature characteristics in the case that the rotational speed N of the cooling fan 8 is a rated rotational speed Nr, and a broken curve K2 indicates the life-temperature characteristics in the case that the rotational speed N of the cooling fan 8 is a maximum value Nmax. Note that unknown life-temperature characteristics of the cooling fan 8 at some rotational speed N can be obtained by linear interpolation of two pieces of known data on the life of the cooling fan 8 at the rotational speed N.

Returning to FIG. 1, the operation time measurement unit 14 measures the elapsed time during the operation of the power conversion device 2, and outputs the measured elapsed time, that is, the operation time of the power conversion device 2, to the cooling fan operation determination unit 16.

The coefficient deriving unit 15 receives a detected value from the temperature sensor 9a and a signal from the operation panel 11. The coefficient deriving unit 15 outputs a signal for controlling the rotational speed of the cooling fan 8 to the cooling fan 8 using the detected value and the signal. The coefficient deriving unit 15 also outputs, to the cooling fan operation determination unit 16, information indicating the relationship between the rotational speed N of the cooling fan 8 and the ambient temperature Ta.

The cooling fan operation determination unit 16 receives information indicating the relationship between the ambient temperature Ta and the life Lsc (Ta), information indicating the relationship between the ambient temperature Ta and the life Lsf (Ta, N) of the cooling fan 8 at each rotational speed, the operation time of the power conversion device 2, the detected value from the temperature sensor 9a, and information indicating the relationship between the rotational speed N of the cooling fan 8 and the ambient temperature Ta. The cooling fan operation determination unit 16 generates a signal for controlling the rotational speed of the cooling fan 8 based on these input signals or input pieces of information, and outputs the generated signal to the cooling fan 8.

Based on the operation time of the power conversion device 2, the signal for controlling the rotational speed of cooling fan 8, and the ambient temperature Ta, the cooling fan operation determination unit 16 measures and holds duration T (t, k) during the operation of the power conversion device 2. Here, the duration T (t, k) is the accumulated time during which the ambient temperature Ta remains constant at "t" when the rotational speed N of the cooling fan 8 is "k".

In the duration T (t, k), "k" is a value within the range of 0 to the maximum rotational speed, and "t" is a value within the range of the minimum ambient temperature to the maximum ambient temperature. Therefore, the cooling fan operation determination unit 16 holds information on the operation time of the power conversion device 2 at a plurality of operation frequencies and information on the operation time of the power conversion device 2 at a plurality of ambient temperatures Ta. For example, assuming that the maximum ambient temperature Ta is Ta_max and the maximum rotational speed N of the cooling fan 8 is Nmax, T (Ta_max, 0) represents the cumulative operation time of the power conversion device 2 in the case that the cooling fan 8 is stationary at the maximum ambient temperature. Note that the measured duration T (t, k) may be held in the cooling fan operation determination unit 16 or may be held in a non-volatile memory (not illustrated in FIG. 1).

Figure 4:
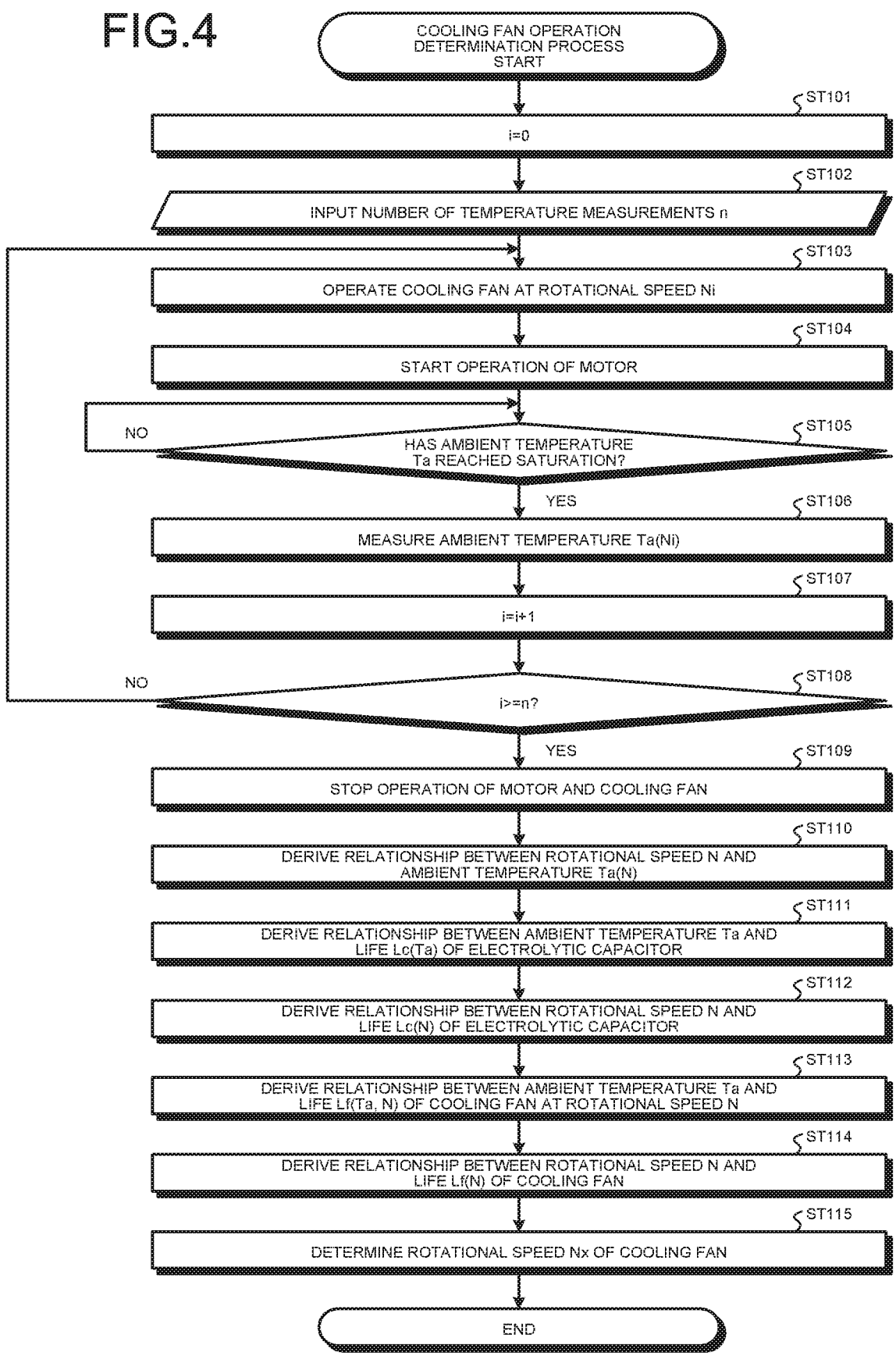
FIG. 4 is a flowchart illustrating a procedure in a cooling fan operation determination unit of the first embodiment.
Figure 5:
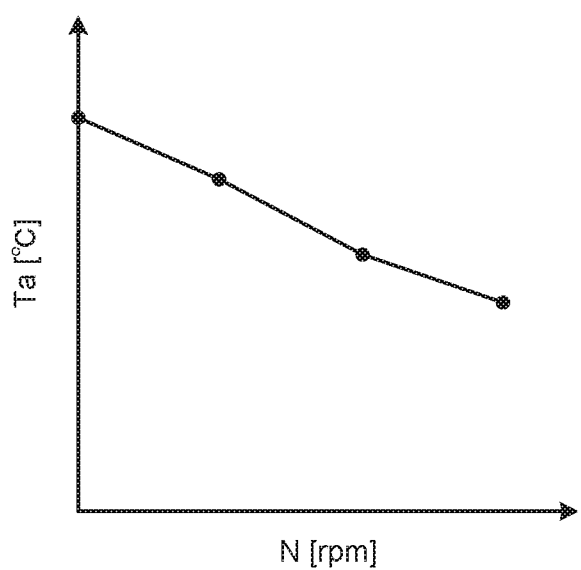
FIG. 5 is a diagram illustrating an example of the relationship between the rotational speed N of the cooling fan and the ambient temperature Ta.
Figure 6:
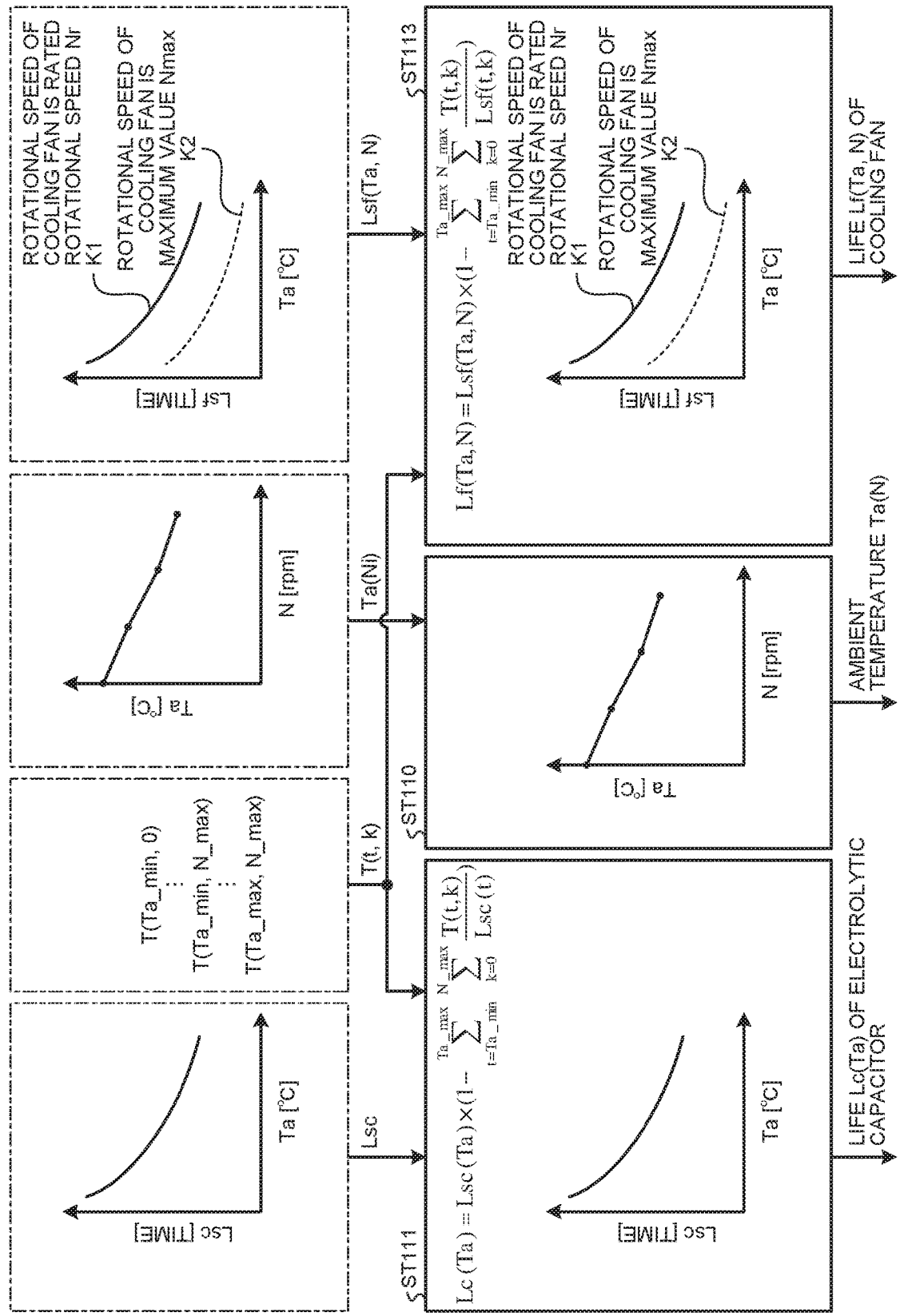
FIG. 6 is a first flow diagram illustrating the flow of data in the flowchart illustrated in FIG. 4.
Figure 7:
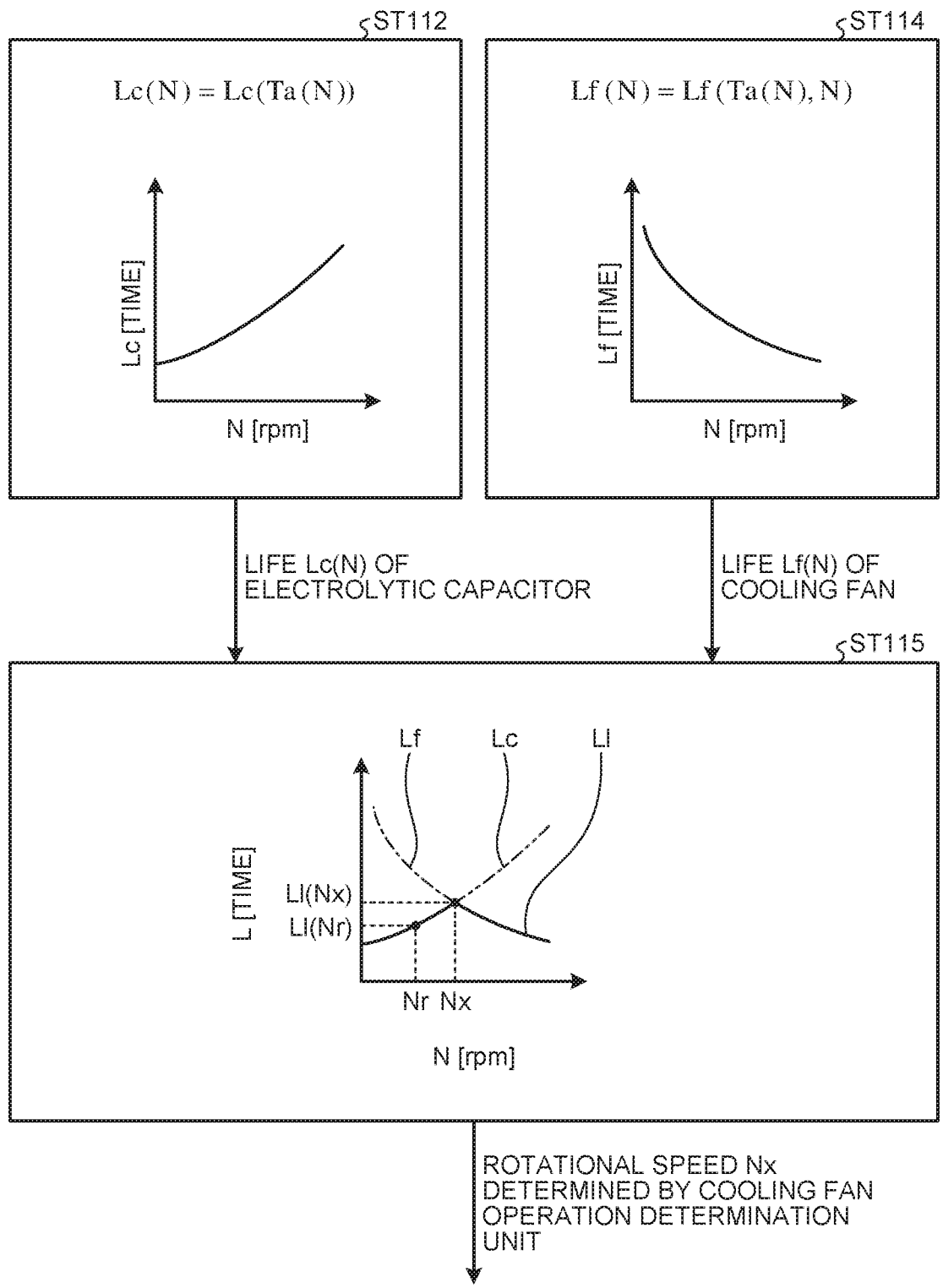
FIG. 7 is a second flow diagram illustrating the flow of data in the flowchart illustrated in FIG. 4.
Figure 8:
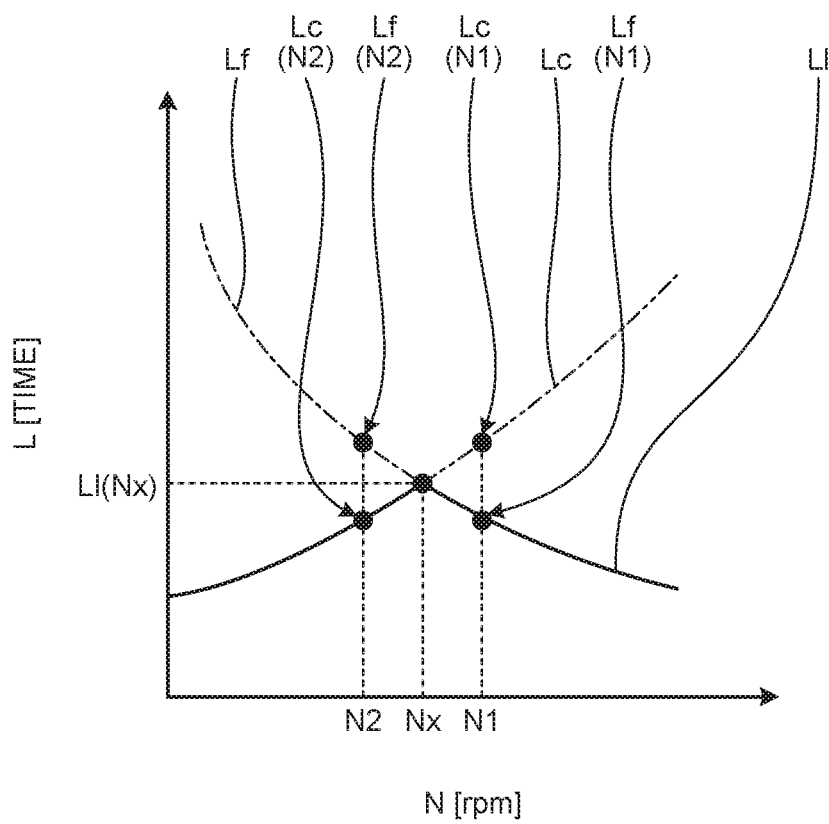
FIG. 8 is a diagram illustrating a comparison between the relationship between the rotational speed N of the cooling fan and the life Lf (N) of the cooling fan and the relationship between the rotational speed N of the cooling fan and the life Lc (N) of the electrolytic capacitor on the same graph.

Next, the operation of the power conversion device 2 according to the first embodiment will be described with reference to the drawings of FIGS. 1 to 8. FIG. 4 is a flowchart illustrating a procedure in the cooling fan operation determination unit 16 of the first embodiment. FIG. 5 is a diagram illustrating an example of the relationship between the rotational speed N of the cooling fan 8 and the ambient temperature Ta. FIG. 6 is a first flow diagram illustrating the flow of data in the flowchart illustrated in FIG. 4. FIG. 7 is a second flow diagram illustrating the flow of data in the flowchart illustrated in FIG. 4. FIG. 8 is a diagram illustrating a comparison between the relationship between the rotational speed N of the cooling fan 8 and the life Lf (N) of the cooling fan 8 and the relationship between the rotational speed N of the cooling fan 8 and the life Lc (N) of the electrolytic capacitor 5 on the same graph.

In FIG. 4, first, in step ST101, a variable i that is used inside the coefficient deriving unit 15 is set to i=0.

In step ST102, the number of temperature measurements n is input from the operation panel 11 to the coefficient deriving unit 15. Note that n is an integer of two or more.

In step ST103, the coefficient deriving unit 15 outputs, to the cooling fan 8, a signal for operating the cooling fan 8 at a rotational speed Ni. The rotational speed Ni of the cooling fan 8 can be determined using the following formula.

[Formula 1]

$$Ni = \frac{N\max}{n-1} \times i \qquad (1)$$

In Formula (1) above, Nmax is the maximum rotational speed of the cooling fan 8.

When a signal for rotating the cooling fan 8 is output, in step ST104, the operation of the motor 3 is started using the actual operation pattern.

In step ST105, based on the detected value input from the temperature sensor 9a to the coefficient deriving unit 15, it is determined whether the ambient temperature Ta has reached saturation. Whether the ambient temperature Ta has reached saturation can be determined by comparing the difference between the current and previous ambient temperatures Ta with a criterion value. Step ST105 is repeated until it is determined that the ambient temperature Ta has reached saturation. If it is determined that the ambient temperature Ta has reached saturation, the process proceeds to step ST106.

In step ST106, the ambient temperature Ta (Ni) in the case that the rotational speed of the cooling fan 8 is Ni is measured, and the measured ambient temperature Ta (Ni) is stored in the coefficient deriving unit 15.

In step ST107, the value of the variable i in the coefficient deriving unit 15 is incremented by one.

In step ST108, the variable i is compared with the number of temperature measurements n in the coefficient deriving unit 15. If the variable i is equal to or greater than the number of temperature measurements n (step ST108, Yes), the process proceeds to step ST109. On the other hand, if the variable i is less than the number of measurements n (step ST108, No), the process returns to step ST103.

In step ST109, the operation of the motor 3 and the cooling fan 8 is stopped.

Here, the operation of steps ST102 to ST109 will be described in detail using an example in which n=2 is satisfied, that is, the temperature is measured twice.

First, the operation of the motor 3 is started with the rotational speed of the cooling fan 8 being zero, that is, with the cooling fan 8 stationary. When the rotational speed N of the cooling fan 8 is zero, it is referred to as "N0".

Next, after the saturation of the ambient temperature Ta (step ST105, Yes), the coefficient deriving unit 15 stores the value Ta (N0), i.e. the ambient temperature in the case that the rotational speed of the cooling fan 8 is N0.

Next, the rotational speed of the cooling fan 8 is set to Nmax, and the operation of the motor 3 is started. After the ambient temperature reaches saturation, the coefficient deriving unit 15 stores the value Ta (Nmax), i.e. the ambient temperature in the case that the rotational speed of the cooling fan 8 is Nmax, and the operation of the motor 3 and the cooling fan 8 is stopped.

FIGS. 6 and 7 depict the flow of data in steps ST110 to ST115.

In step ST110, the coefficient deriving unit 15 obtains the relationship between the rotational speed N of the cooling fan 8 and the ambient temperature Ta (N). Specifically, unknown data on the ambient temperature Ta (N) in the case that the rotational speed of the cooling fan 8 is N are obtained by linear interpolation of two pieces of known data Ta (Ni), whereby the relationship between the rotational speed N of the cooling fan 8 and the ambient temperature Ta is obtained. The information Ta (N) indicating the relationship between the rotational speed N of the cooling fan 8 and the ambient temperature Ta is output to the cooling fan operation determination unit 16. The known data Ta (Ni) are the data measured in step ST106 and are held in the coefficient deriving unit 15.

FIG. 5 is a diagram illustrating an example of the relationship between the rotational speed of the cooling fan 8 and the ambient temperature in the case that the number of temperature measurements n is four. This diagram indicates the relationship in which the ambient temperature decreases as the rotational speed of the cooling fan 8 increases.

Returning to FIG. 4 and the flow of FIG. 6, in step ST111, the relationship between the ambient temperature Ta and the life Lc (Ta) of the electrolytic capacitor 5 is obtained by the cooling fan operation determination unit 16. Specifically, the life Lc (Ta) of the electrolytic capacitor 5 at the ambient temperature Ta can be calculated using the following formula from the relational expression between the ambient temperature Ta and the life Lsc (Ta) of the electrolytic capacitor 5 at the operation time 0 and the duration T (t, k) described above.

[Formula 2]

$$Lc(Ta) = Lsc(Ta) - \sum_{t=Ta\_min}^{Ta\_max} \sum_{k=0}^{N\_max} \frac{Lsc(Ta)}{Lsc(t)} \times T(t, k) = \qquad (2)$$

$$Lsc(Ta) \times \left(1 - \sum_{t=Ta\_min}^{Ta\_max} \sum_{k=0}^{N\_max} \frac{T(t, k)}{Lsc(t)}\right)$$

In Formula (2) above, Ta_max is the maximum ambient temperature Ta, and Ta_min is the minimum ambient temperature Ta. Note that data indicating the relationship between the ambient temperature Ta and the life Lsc (Ta) of the electrolytic capacitor 5 at the operation time 0 are stored in the electrolytic capacitor life storage unit 12. Data on the duration T (t, k) are held in the cooling fan operation determination unit 16.

In Formula (2) above, the cumulative operation time of the electrolytic capacitor 5 converted to the ambient temperature Ta is subtracted from the life Lsc (Ta) of the unused electrolytic capacitor 5 at the ambient temperature Ta, whereby the expected life Lc (Ta) of the electrolytic capacitor 5 that is used at the ambient temperature Ta is calculated.

Proceeding to FIG. 7, in step ST112, the relationship between the rotational speed N of the cooling fan 8 and the life Lc (N) of the electrolytic capacitor 5 is obtained by the cooling fan operation determination unit 16. Specifically, the life Lc (N) is calculated using Formula (3) below obtained by substituting the ambient temperature Ta (N) calculated in step ST110 for the ambient temperature Ta indicated in Formula (2) derived in step ST111.

[Formula 3]

$$Lc(N) = Lc(Ta(N)) = Lsc(Ta(N)) \times \left(1 - \sum_{t=Ta\_min}^{Ta\_max} \sum_{k=0}^{N\_max} \frac{T(t, k)}{Lsc(t)}\right) \qquad (3)$$

Returning to FIG. 6, in step ST113, the relationship between the ambient temperature Ta and the life Lf (Ta, N) of the cooling fan 8 in the case that the rotational speed of the cooling fan 8 is N is obtained by the cooling fan operation determination unit 16. Specifically, the life Lf (Ta, N) of the cooling fan 8 in the case that the rotational speed of the cooling fan 8 is N and the ambient temperature is Ta can be calculated in the following manner from the relationship between the ambient temperature Ta and the life Lsf (Ta, N) of the cooling fan 8 at the operation time 0 stored in the cooling fan life storage unit 13 and the above-mentioned duration T (t, k) held in the cooling fan operation determination unit 16.

[Formula 4]

$$Lf(Ta, N) = Lsf(Ta, N) - \sum_{t=Ta\_min}^{Ta\_max} \sum_{k=0}^{N\_max} \frac{Lsf(Ta, N)}{Lsf(t, k)} \times T(t, k) = \qquad (4)$$

$$Lsf(Ta, N) \times \left(1 - \sum_{t=Ta\_min}^{Ta\_max} \sum_{k=0}^{N\_max} \frac{T(t, k)}{Lsf(t)}\right)$$

In Formula (4) above, Ta_max is the maximum ambient temperature Ta, Ta_min is the minimum ambient temperature Ta, and N max is the maximum rotational speed N of the cooling fan 8. Note that data indicating the relationship between the ambient temperature Ta and the life Lsf (Ta, N) of the cooling fan 8 at the operation time 0 are stored in the cooling fan life storage unit 13. Data on the duration T (t, k) are held in the cooling fan operation determination unit 16.

In Formula (4) above, the cumulative operation time of the cooling fan 8 converted to the ambient temperature Ta in the case that the rotational speed of the cooling fan 8 is N is subtracted from the life Lsf (Ta, N), whereby the life Lf (Ta, N) is calculated. Here, the life Lsf (Ta, N) is the life of the unused cooling fan 8 at the ambient temperature Ta in the case that the rotational speed of the cooling fan 8 is N. The life Lf (Ta, N) is the expected life of the cooling fan 8 that is used at the ambient temperature Ta and at the rotational speed N.

Proceeding to FIG. 7, in step ST114, the relationship between the rotational speed N of the cooling fan 8 and the life Lf (N) of the cooling fan 8 is obtained by the cooling fan operation determination unit 16. Specifically, the life Lf (N) is calculated using Formula (5) below obtained by substituting the ambient temperature Ta (N) calculated in step ST110 for the ambient temperature Ta indicated in Formula (4) derived in step ST113.

[Formula 5]

$$Lf(N) = Lf(Ta(N), N) = Lsf(Ta(N), N) \times \left(1 - \sum_{t=Ta\_min}^{Ta\_max} \sum_{k=0}^{N\_max} \frac{T(t, k)}{Lsf(t)}\right) \qquad (5)$$

In step ST115, a rotational speed Nx of the cooling fan 8 that makes the lives of the cooling fan 8 and the electrolytic capacitor 5 equal is determined by the cooling fan operation determination unit 16. The rotational speed Nx is determined using Formulas (6) and (7) below.

[Formula 6]

$$\begin{cases} LI(N) = Lf(N) & \text{(In a case where } LF(N) \le Lc(N)) \\ LI(N) = Lc(N) & \text{(In a case where } LF(N) > Lc(N)) \end{cases} \quad (6)$$

[Formula 7]

$$LI(Nx) = \max(LI(N)) \ (0 < N \le N\max) \quad (7)$$

The waveforms in step ST115 of FIG. 7 are illustrated in FIG. 8. In FIG. 8, the thick solid lines indicate the values of LI (N) calculated using Formula (6) above, and the intersection between the life Lc (N) of the electrolytic capacitor 5 and the life Lf (N) of the cooling fan 8 indicates the value of LI (Nx) calculated using Formula (7) above.

In FIG. 8, suppose the rotational speed of the cooling fan 8 driven according to the rating, that is, the rated rotational speed of the cooling fan 8, is N1. In this case, the life of the cooling fan 8 is Lf (N1), which is shorter than the life Lc (N1) of the electrolytic capacitor 5. If the life of the electrolytic capacitor 5 can be made shorter than Lc (N1), in the present embodiment, by making the rotational speed of the cooling fan 8 lower than N1, the life of the electrolytic capacitor 5 can be made shorter than Lc (N1) and the life of the cooling fan 8 can be made longer than Lf (N1).

Alternatively, in FIG. 8, suppose the rotational speed of the cooling fan driven according to the rating, that is, the rated rotational speed of the cooling fan 8, is N2. In this case, the life of the cooling fan 8 is Lf (N2), which is longer than the life Lc (N2) of the electrolytic capacitor 5. If the life of the cooling fan 8 can be made shorter than Lf (N2), in the present embodiment, by making the rotational speed of the cooling fan 8 greater than N2, the life of the cooling fan 8 can be made shorter than Lf (N2) and the life of the electrolytic capacitor 5 can be made longer than Lc (N2).

As described above, the method according to the present embodiment enables control of the life of the cooling fan that is the first component and the life of the electrolytic capacitor that is the second component whose life varies according to the drive amount, namely rotational speed, of the cooling fan based on the relationship between the cooling fan, the electrolytic capacitor, and the drive amount of the cooling fan.

Thus, by controlling the lives of the first component and the second component, the timing of replacement of the first component or the second component can be controlled.

For example, in FIG. 8, if the rotational speed N of the cooling fan 8 is set to N1 or N2 at which the life of the cooling fan 8 and the life of the electrolytic capacitor 5 are different, one component needs to be replaced before the life of the other component ends. In the present embodiment, the rotational speed Nx that makes the life of the cooling fan 8 and the life of the electrolytic capacitor 5 approximately equal enables simultaneous replacement of the two components. Here, the replacement of components includes replacing the power conversion device itself.

For example, if it is necessary to replace the power conversion device itself for replacing one of the components, the shortest life of the component can be extended according to the present embodiment, so that the effect of extending the life of the power conversion device itself can be obtained.

That is, the rotational speed Nx for prolonging the life can be the value obtained using Formulas (6) and (7) or, as described above, can be a value that satisfies the following formula.

[Formula 8]

$$LI(Nx) > LI(Nr) \quad (8)$$

In Formula (8) above, Nr is the rated rotational speed of the cooling fan 8. In any case, by selecting the rotational speed N that makes the difference between the life Lc of the electrolytic capacitor 5 and the life Lf of the cooling fan 8 smaller than the difference in the case that the cooling fan 8 is operated at the rated value, namely the rated rotational speed Nr, in other words, by selecting the rotational speed N that extends the shorter one of the life Lc of the electrolytic capacitor 5 and the life Lf of the cooling fan 8, the life of the power conversion device 2 can be prolonged.

In the present embodiment, the rotational speed of the cooling fan 8 per unit time is the drive amount of the cooling fan 8. Although the life can be controlled simply by the rotational speed, in order to obtain the exact life, factors such as the drive time of the cooling fan 8 or the drive sequence related to the increase of the rotational speed at the start of driving may also be considered.

In the present embodiment, the lives of the first component and the second component are controlled. Needless to say, the life of each component may be controlled further in consideration of the relationship with the life of another component that varies according to the drive amount of the first component.

In the present embodiment, the power conversion device has been described as an example. However, the power conversion device may be replaced with an electronic device. The first component may be a cooling fan, and the second component may be an electronic circuit that is cooled by the cooling fan. The present embodiment can be applied to components of an electronic device, specifically, the first component and the second component whose life varies according to the drive amount of the first component.

Second Embodiment

Figure 9:
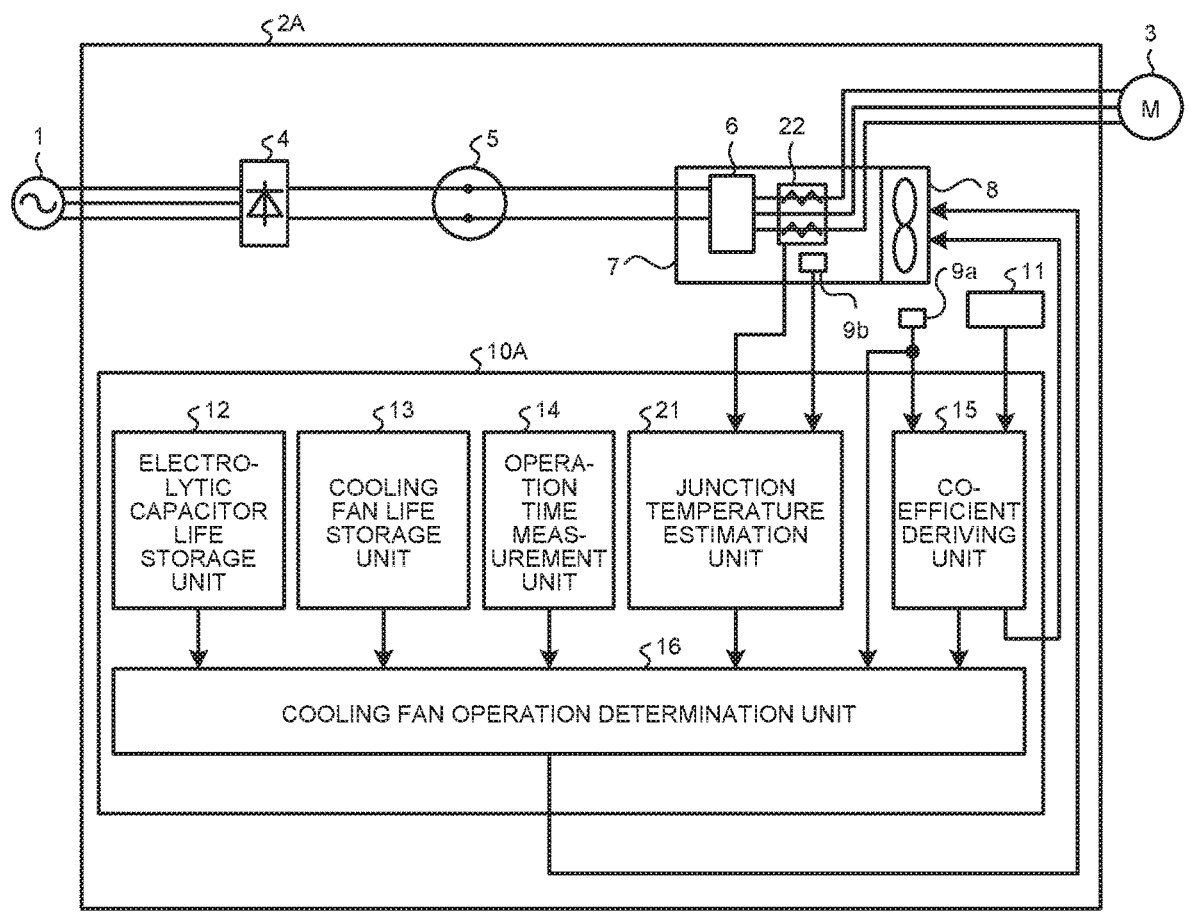
FIG. 9 is a block diagram illustrating an exemplary configuration of a power conversion device according to a second embodiment.

FIG. 9 is a block diagram illustrating an exemplary configuration of a power conversion device according to the second embodiment. The power conversion device 2A according to the second embodiment includes a current sensor 22 for detecting a load current and a temperature sensor 9b which is a second temperature sensor in addition to the components of the power conversion device 2 according to the first embodiment illustrated in FIG. 1. Moreover, a junction temperature estimation unit 21 is additionally provided in the cooling fan control unit 10 to constitute a cooling fan control unit 10A. The other configuration is the same as or equivalent to the configuration of the first embodiment. The same or equivalent components are denoted by the same reference signs, and redundant descriptions are omitted.

In the second embodiment, the temperature sensor 9b is one of the sensors provided in the power conversion device 2A. While the temperature sensor 9a, which is the first temperature sensor, measures the ambient temperature of the electrolytic capacitor 5 and the cooling fan 8, the temperature sensor 9b, which is the second temperature sensor, measures the temperature of a fin (not illustrated) attached to the heat sink 7.

The current sensor 22 detects a load current which is a current flowing in and out of the motor 3. The junction temperature estimation unit 21 receives a detected value from the current sensor 22 and a detected value from the temperature sensor 9b. Inside the junction temperature estimation unit 21, data on the thermal resistance of the power module 6 and table data about the loss of each load current are stored. The junction temperature estimation unit 21 estimates a junction temperature Tj in the power module 6 using the detected value from the current sensor 22, the detected value from the temperature sensor 9b, and the data held inside, and outputs the junction temperature Tj to the cooling fan operation determination unit 16. Here, the junction temperature Tj refers to the temperature of the joint region where a semiconductor chip is joined. Consequently, in addition to the input information described in the first embodiment, information on the junction temperature Tj in the power module 6 is input to the cooling fan operation determination unit 16.

In the above description, the temperature sensor 9b measures the temperature of the fin (not illustrated) attached to the heat sink 7. However, instead of measuring the temperature of the fin, the temperature sensor 9b may detect the temperature of a fin attachment (not illustrated). In other words, the temperature sensor 9b may be provided at any part of the heat sink 7, or a cooler, as long as it can estimate the junction temperature Tj in the power module 6.

In the first embodiment, the power conversion device 2 is operated using the rotational speed Nx of the cooling fan 8 determined by the cooling fan operation determination unit 16, whereby the life of the power conversion device 2 is prolonged. On the other hand, the cooling fan operation determination unit 16 of the second embodiment estimates the rotational speed Nx of the cooling fan 8 using information on the junction temperature Tj in the power module 6. Consequently, the rotational speed Nx of the cooling fan 8 can be determined in a range that does not damage the power module 6 to prolong the life of the power conversion device 2A.

Figure 10:
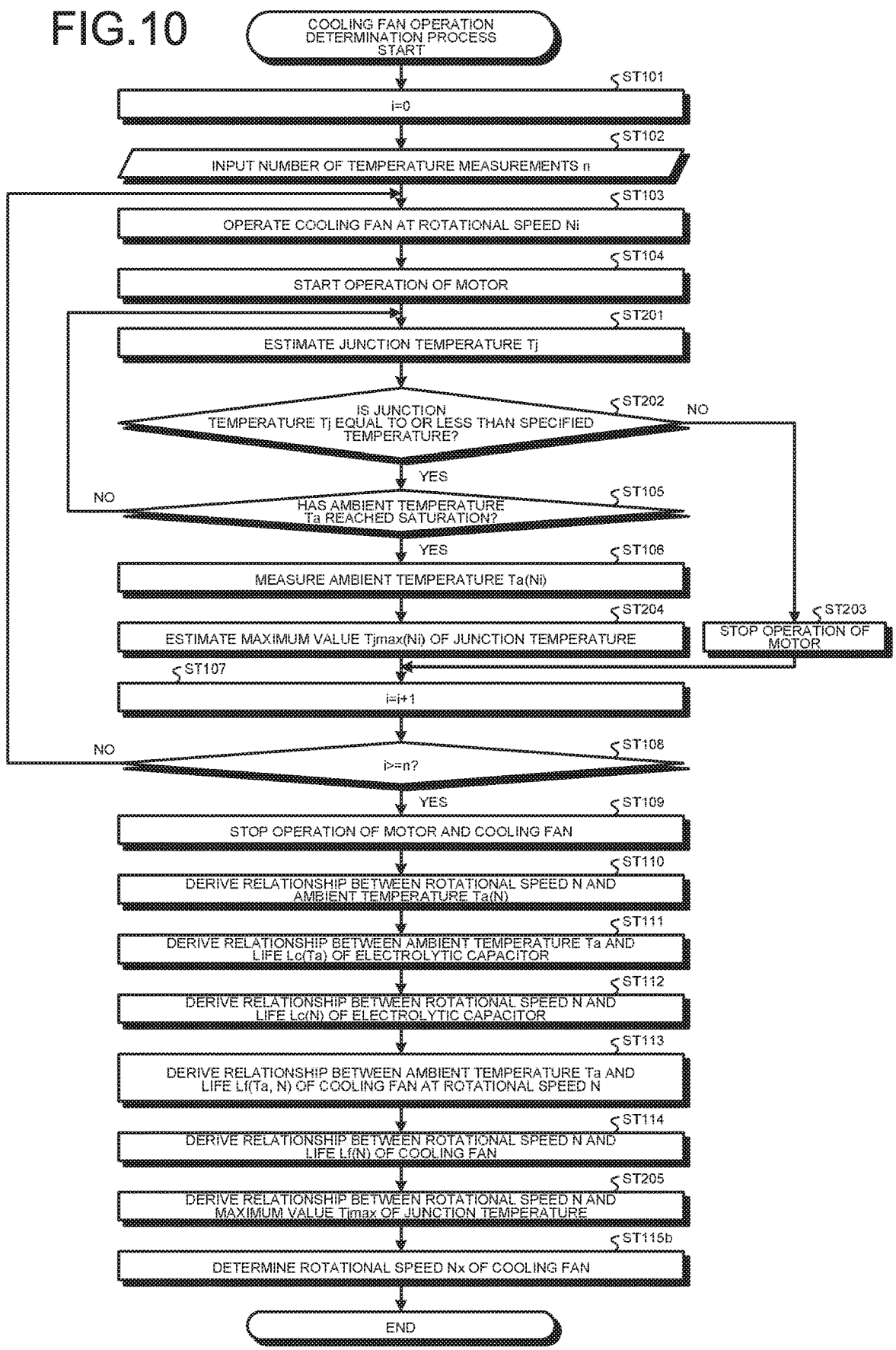
FIG. 10 is a flowchart illustrating a procedure in the cooling fan operation determination unit of the second embodiment.
Figure 11:
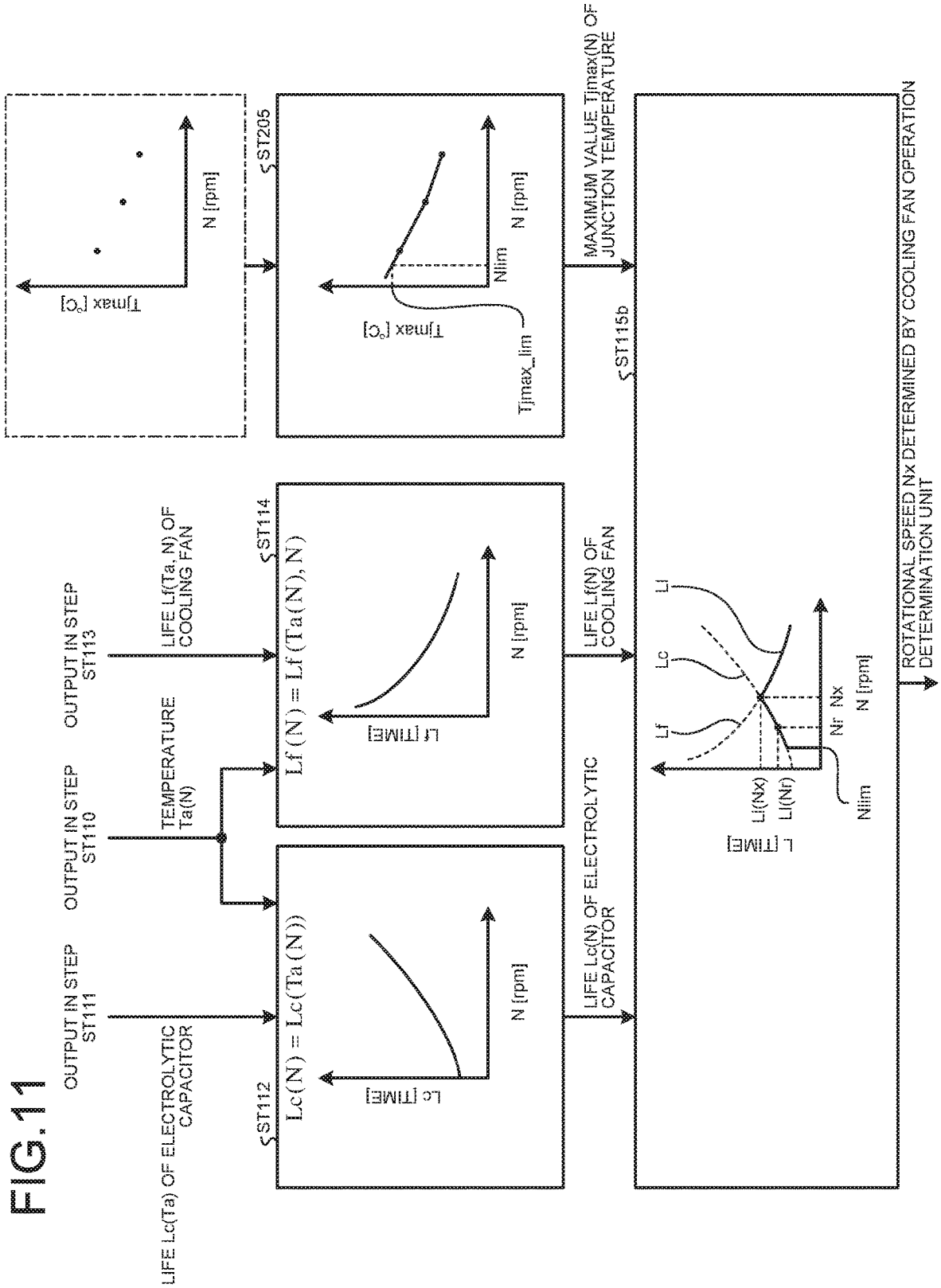
FIG. 11 is a flow diagram illustrating the flow of data in the flowchart illustrated in FIG. 10.

Next, the operation of the power conversion device 2A according to the second embodiment will be described with reference to the drawings of FIGS. 9 to 11. FIG. 10 is a flowchart illustrating a procedure in the cooling fan operation determination unit 16 of the second embodiment. FIG. 11 is a flow diagram illustrating the flow of data in the flowchart illustrated in FIG. 10.

First, in FIG. 10, steps ST101 to ST104 are the same as those of the first embodiment illustrated in FIG. 4. When step ST104 is finished, the process proceeds to step ST201.

In step ST201, the junction temperature estimation unit 21 estimates the junction temperature Tj using the following formula.

[Formula 9]

$$Tj = P(I) \times Rth + Tf \quad (9)$$

In Formula (9) above, I is the load current obtained from the value detected by the current sensor 22, P (I) is the chip loss obtained from the loss table data and the load current I, Rth is the thermal resistance of the power module 6, and Tf is the fin temperature obtained from the value detected by the temperature sensor 9b. The junction temperature Tj estimated by the junction temperature estimation unit 21 is output to the cooling fan operation determination unit 16.

In step ST202, the cooling fan operation determination unit 16 determines whether the junction temperature Tj obtained in step ST201 is equal to or less than a specified temperature Tjmax_lim set in advance. Here, the specified temperature Tjmax_lim is a junction temperature that complies with specifications for preventing damage to the power module.

If the junction temperature Tj is equal to or less than the specified temperature Tjmax_lim (step ST202, Yes), the process proceeds to step ST105. On the other hand, if the junction temperature Tj is greater than the specified temperature Tjmax_lim (step ST202, No), the process proceeds to step ST203 to temporarily stop the operation of the motor 3, and then proceeds to step ST107.

In the determination process of step ST202, "Yes" is selected when the junction temperature Tj is equal to the specified temperature Tjmax_lim. Alternatively, "No" may be selected. That is, either "Yes" or "No" may be selected when the junction temperature Tj is equal to the specified temperature Tjmax_lim.

The determination process of step ST105 and the temperature measurement of step ST106 are the same as or equivalent to those of the first embodiment. However, if it is determined that the ambient temperature Ta has not reached saturation (step ST105, No), the process returns to step ST201. If it is determined that the ambient temperature Ta has reached saturation (step ST105, Yes), step ST106 is performed, and the process proceeds to step ST204.

In step ST204, a maximum value Tjmax (Ni) of the junction temperature Tj in the case that the rotational speed of the cooling fan 8 is Ni is estimated. The estimated maximum value Tjmax (Ni) is held in the cooling fan operation determination unit 16. Note that the maximum value Tjmax (Ni) is the highest of the junction temperatures Tj estimated using Formula (9) above over one operation cycle.

After step ST204, steps ST107 to ST114 are performed. These steps are the same as those of the first embodiment illustrated in FIG. 4. When step ST114 is finished, the process proceeds to step ST205.

FIG. 11 depicts the flow of data in steps ST110 to ST114, step ST205, and step ST115b.

In FIG. 11, in step ST112, the relationship between the rotational speed N of the cooling fan 8 and the life Lc (N) of the electrolytic capacitor 5 is obtained by the cooling fan operation determination unit 16. In this process, information on the life Lc (Ta) of the electrolytic capacitor 5 derived in step ST111 and information on the ambient temperature Ta (N) calculated in step ST110 are used as illustrated in the drawing.

In step ST114, the relationship between the rotational speed N of the cooling fan 8 and the life Lf (N) of the cooling fan 8 is obtained by the cooling fan operation determination unit 16. In this process, information on the life Lf (Ta, N) of the cooling fan 8 derived in step ST113 and information on the ambient temperature Ta (N) calculated in step ST110 are used as illustrated in the drawing.

Then, in step ST205, the relationship between the rotational speed N of the cooling fan 8 and the maximum value Tjmax of the junction temperature Tj is obtained by the cooling fan operation determination unit 16. Specifically, unknown data on the maximum value Tjmax (N) of the junction temperature Tj in the case that the rotational speed of the cooling fan 8 is N are obtained by linear interpolation of two pieces of known data Tjmax (Ni), whereby the relationship between the rotational speed N of the cooling fan 8 and the maximum value Tjmax of the junction temperature Tj is obtained. The information indicating the relationship between the rotational speed N of the cooling fan 8 and the maximum value Tjmax of the junction temperature Tj is output to the cooling fan operation determination unit 16. The known data Tjmax (Ni) are the data estimated in step ST201 and are held in the cooling fan operation determination unit 16.

In step ST115*b*, the rotational speed Nx that makes the life of the power conversion device 2A longest is determined by the cooling fan operation determination unit 16. The rotational speed Nx is determined using Formula (7) above and Formula (10) below.

[Formula 10]

$$\begin{cases} LI(N) = 0 & \text{(In a case where } 0 \leq N \leq N\text{lim)} \\ LI(N) = Lf(N) & \begin{pmatrix} \text{In a case where } N\text{lim} < N \leq N\text{max and} \\ Lf(N) \leq Lc(N) \end{pmatrix} \\ LI(N) = Lc(N) & \begin{pmatrix} \text{In a case where } N\text{lim} < N \leq N\text{max and} \\ Lf(N) > Lc(N) \end{pmatrix} \end{cases} \quad (10)$$

In Formula (10) above, Nlim is the rotational speed of the cooling fan 8 that makes the maximum value Tjmax of the junction temperature Tj equal to a specified temperature set in advance. That is, Nlim is the minimum rotational speed at which the joint reliability of the semiconductor chip is guaranteed. The rotational speed Nx of the cooling fan 8 is not necessarily obtained using Formulas (7) and (10), and may be a value that satisfies Formula (8) above.

The above-mentioned method according to the second embodiment not only achieves the effect described in the first embodiment but also enables the rotational speed N of the cooling fan 8 to be determined in a range that does not damage the power module 6.

Figure 12:
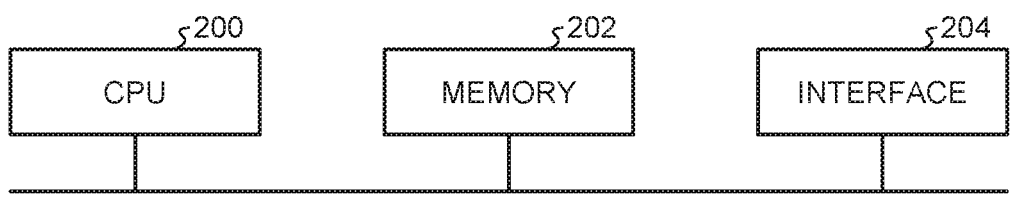
FIG. 12 is a block diagram illustrating an example of a hardware configuration for implementing cooling fan control units in the first and second embodiments.
Figure 13:
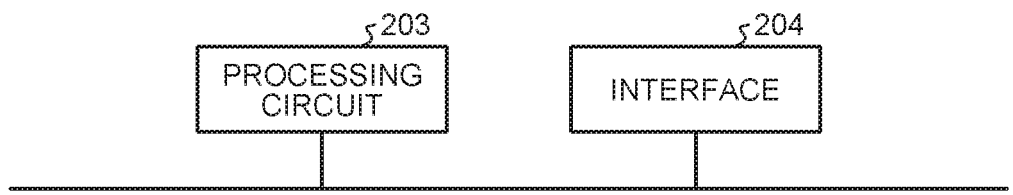
FIG. 13 is a block diagram illustrating another example of a hardware configuration for implementing cooling fan control units in the first and second embodiments.

Next, hardware configurations for implementing the functions of the cooling fan control units 10 and 10A in the first and second embodiments will be described with reference to the drawings of FIGS. 12 and 13. FIG. 12 is a block diagram illustrating an example of a hardware configuration for implementing the cooling fan control units 10 and 10A in the first and second embodiments. FIG. 13 is a block diagram illustrating another example of a hardware configuration for implementing the cooling fan control units 10 and 10A in the first and second embodiments.

The above functions of the cooling fan control units 10 and 10A can be implemented with a configuration including a central processing unit (CPU) 200, a memory 202, and an interface 204 as illustrated in FIG. 12. The CPU 200 performs computations. Programs that are read by the CPU 200 are saved in the memory 202. Signals are input and output through the interface 204. Note that the CPU 200 may be a computing unit such as a microprocessor, a microcomputer, a processor, or a digital signal processor (DSP). Examples of the memory 202 include non-volatile or volatile semiconductor memories such as a random access memory (RAM), a read only memory (ROM), a flash memory, an erasable programmable ROM (EPROM), and an electrically EPROM (EEPROM, registered trademark). Data or information calculated or derived by each unit constituting the cooling fan control units 10 and 10A can be held in a non-volatile memory.

Specifically, programs for executing the functions of the cooling fan control units 10 and 10A are stored in the memory 202. By exchanging necessary information via the interface 204, the CPU 200 executes the various computation processes described in the first and second embodiments. Data calculated or derived by each unit constituting the cooling fan control units 10 and 10A can be held in a non-volatile memory of the memory 202.

The CPU 200 and the memory 202 illustrated in FIG. 12 may be replaced with a processing circuit 203 as illustrated in FIG. 13. For example, the processing circuit 203 is a single circuit, a composite circuit, a programmed processor, a parallel programmed processor, an application specific integrated circuit (ASIC), a field-programmable gate array (FPGA), or a combination thereof.

Third Embodiment

Figure 14:
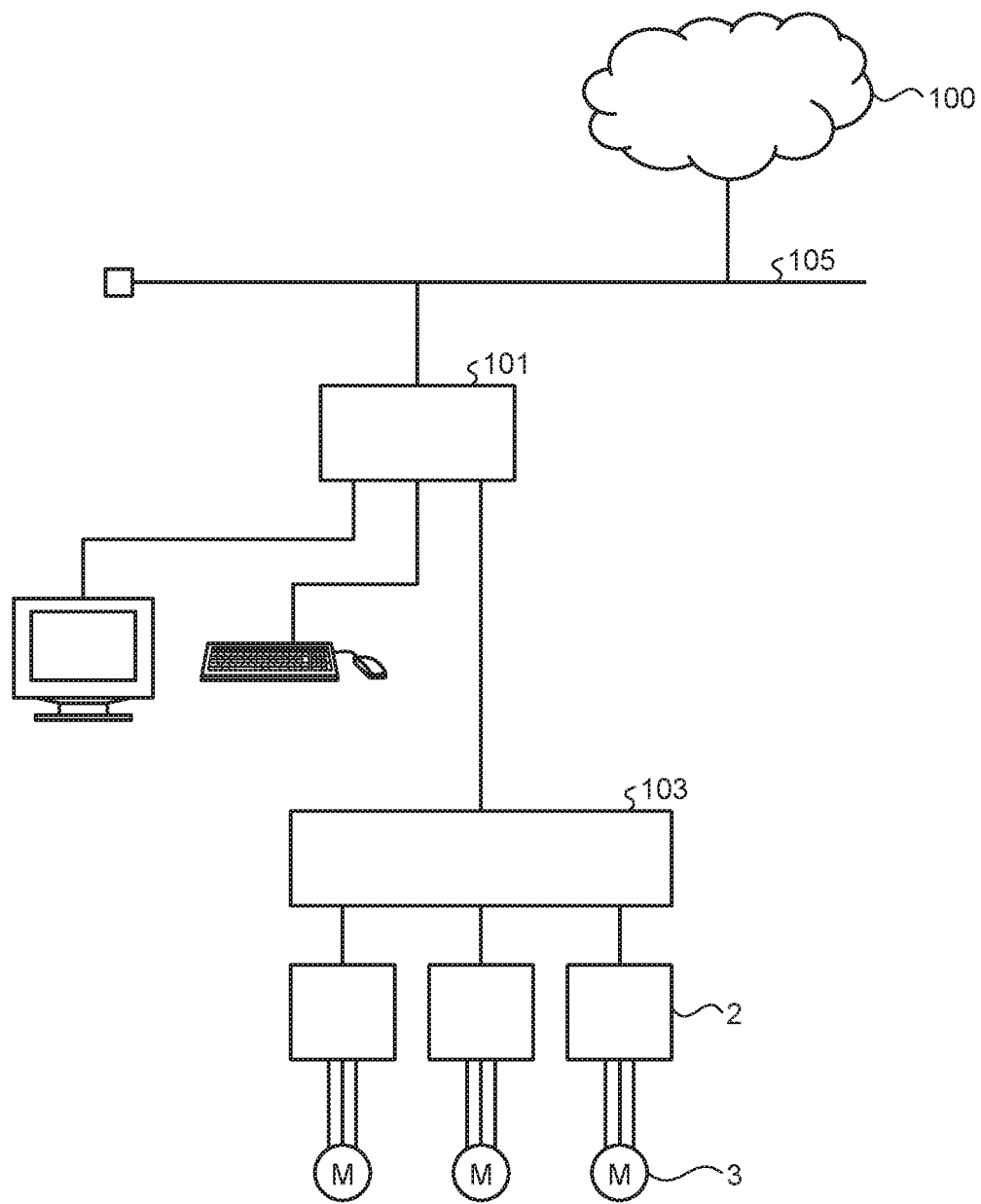
FIG. 14 is a diagram illustrating an exemplary configuration of a control system for power conversion devices according to a third embodiment.

FIG. 14 is a diagram illustrating an exemplary configuration of a control system for power conversion devices according to the third embodiment. The control system for power conversion devices according to the third embodiment is unique in that the power conversion devices 2 are connected to a programmable logic controller (PLC) 103. Note that the PLC 103 is connected to an information processing device 101, and the information processing device 101 can be connected to a server 100 over a communication network 105. Hereinafter, differences from the first and second embodiments will be mainly described.

In the third embodiment, the cooling fan control units 10 and 10A illustrated in FIGS. 1 and 9 are incorporated in the information processing device 101. As illustrated in FIG. 14, the information processing device 101 performs drive control of the cooling fans 8 (not illustrated in FIG. 14) provided in the plurality of power conversion devices 2. That is, the control system for power conversion devices according to the third embodiment constitutes a control system for cooling fans.

The information processing device 101 stores, via the PLC 103, the lives of the electrolytic capacitors 5 and the cooling fans 8 in the plurality of power conversion devices 2. The information processing device 101 further obtains the life characteristics of the plurality of power conversion devices 2 as illustrated in FIG. 8, and computes the rotational speed N of the cooling fan 8 of each power conversion device 2 such that, for example, the electrolytic capacitors 5 of the plurality of power conversion devices 2 have approximately the same life. This enables simultaneous replacement of the electrolytic capacitors 5 and the cooling fans 8 of the plurality of power conversion devices 2, so that the frequency of replacement maintenance can be reduced.

Alternatively, the number of electrolytic capacitors 5 to be replaced can be adjusted according to the stock status of the electrolytic capacitors 5. In this case, data such as the number of components in stock, the time of delivery, and the number of components to be delivered are stored on the server 100, and these data can be checked as needed on the server 100 and reflected in the life control of the electrolytic capacitors 5 and the cooling fans 8 by the information processing device 101.

Further, data such as temperature conditions in the place where the motors 3 are installed, e.g. a factory, and operation schedules for the motors 3 are stored on the server 100, and these data can be used together with the estimated life characteristics of the electrolytic capacitors 5 and the cooling fans 8 for controlling the timing of replacement of components.

As described in the first or second embodiment, the life characteristics of the electrolytic capacitor 5 and the cooling fan 8 are estimated, and the rotational speed N of the cooling fan 8, that is, the cooling fan 8, is controlled, so that the lives of these components can be controlled. Therefore, the control system for cooling fans according to the third embodiment can be used to determine the operation of the cooling fans 8 by determining the rotational speed N in consideration of the lives of the plurality of power conversion devices 2, the stock status of replacement components, or other data in the factory where the motors are installed.

Although the PLC 103 is used in the present embodiment, the PLC 103 may not necessarily be used. The information processing device 101 may be directly connected to the power conversion devices 2.

Although the plurality of power conversion devices 2 is used in the present embodiment, the plurality of power conversion devices 2 may not necessarily be used. Even in the case of controlling the lives of the electrolytic capacitor and the cooling fan in a single power conversion device 2 as described in the first or second embodiment, the stock status of replacement components and data in the factory can be taken into consideration.

In the example described in the present embodiment, the information processing device 101 includes various life storage units. However, the present embodiment is not necessarily limited to this example. The life storage units may be provided in the PLC 103, may be located on the server 100, or may be located in the power conversion devices 2 as described in the first and second embodiments.

In the present embodiment, the communication network 105 may be a wired or wireless network, and the server 100 may be a cloud server on a cloud. Such a system configuration enables remote registration of data, e.g. delivery schedules for components, on the server 100, whereby remote data can be reflected in the control of the cooling fans 8.

Fourth Embodiment

Figure 15:
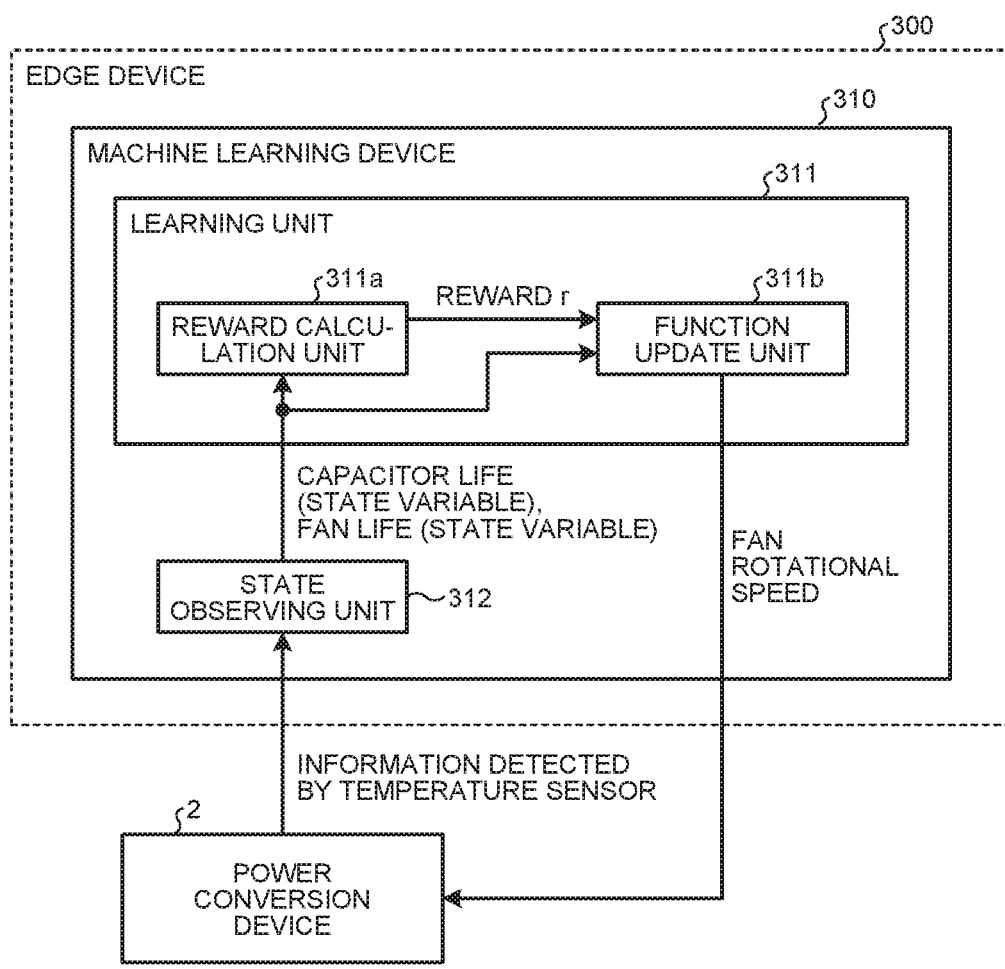
FIG. 15 is a diagram illustrating an exemplary configuration of a machine learning device according to a fourth embodiment.

In the fourth embodiment, a machine learning device will be described. FIG. 15 is a diagram illustrating an exemplary configuration of a machine learning device 310 according to the fourth embodiment. The machine learning device 310 according to the fourth embodiment is a device for learning a drive condition, e.g. the rotational speed N, for the cooling fan 8 that is the first component. The machine learning device 310 includes a learning unit 311 and a state observing unit 312 as illustrated in FIG. 15. The machine learning device 310 is provided in an edge device 300. The edge device 300 is located on a higher level than the power conversion device 2 described in the first to third embodiments, and is the information processing device 101 illustrated in FIG. 14. Note that the machine learning device 310 may be provided inside the power conversion devices 2 illustrated in FIG. 14, may be provided in the PLC 103, or may be provided on the server 100 such as a cloud server.

The information detected by the temperature sensor 9a is input to the state observing unit 312 from the power conversion device 2. The state observing unit 312 observes and outputs the "capacitor life" and the "fan life" as state variables. Here, the "capacitor life" is the life of the electrolytic capacitor 5, and the "fan life" is the life of the cooling fan 8.

The learning unit 311 receives the state variable "capacitor life" and the state variable "fan life". The learning unit 311 feeds back the fan rotational speed, i.e. information on the rotational speed of the cooling fan 8, to the power conversion device 2.

The learning unit 311 includes a reward calculation unit 311a and a function update unit 311b. The reward calculation unit 311a calculates a reward r based on the state variables, namely the capacitor life and the fan life. The function update unit 311b updates an action value function Q (s, a) according to the reward r calculated by the reward calculation unit 311a, the capacitor life, and the fan life. Based on the updated function, the function update unit 311b determines the rotational speed N of the cooling fan 8 to be operated next. The rotational speed N of the cooling fan 8 is one of the drive conditions for the cooling fan 8. The determined rotational speed N of the cooling fan 8 is transmitted, that is, fed back, to the power conversion device 2.

The learning unit 311 may use any learning algorithm. Hereinafter, an example in which reinforcement learning is applied will be described.

In reinforcement learning, an agent (subject of an action) in an environment observes the current state and determines the action to take. The agent gets a reward from the environment by selecting an action. The agent learns how to maximize the reward through a series of actions. Q-learning or TD-learning is known as a representative method of reinforcement learning. For example, in the case of Q-learning, a general update expression for the action value function Q (s, a) is represented using Formula (11) below. Note that the action value function Q (s, a) is also called an action value table.

[Formula 11]

$$Q(s_t, a_t) \leftarrow Q(s_t, a_t) + \alpha\left(r_{t+1} + \gamma \max_a Q(s_{t+1}, a) - Q(s_t, a_t)\right) \quad (11)$$

In Formula (11) above, $s_t$ represents the state at the time t, $a_t$ represents the action at the time t, and $s_{t+1}$ represents the state at the time t+1. The action $a_t$ changes the state to $s_{t+1}$. In addition, $r_{t+1}$ represents the reward that can be gained due to the change of the state $s_t$, $\gamma$ represents a discount rate, and $\alpha$ represents a learning coefficient. In a case where Q-learning is applied to the present embodiment, the action $a_t$ is the fan rotational speed, namely the rotational speed of the cooling fan 8.

Here, suppose the action value of the best action $a_{t+1}$ at the time t+1 is greater than the action value Q of the action at executed at the time t. In this case, the action value Q increases in the update expression represented by Formula (11). On the other hand, if the action value of the best action $a_{t+1}$ at the time t+1 is less than the action value Q of the action $a_t$ executed at the time t, the action value Q decreases in the update expression. In other words, the action value function Q ($s_t$, $a_t$) is updated such that the action value Q of the action $a_t$ at the time t approaches the best action value at the time t+1. By updating the action value function Q ($s_t$, $a_t$), the best action value in a certain state is sequentially propagated to the action values Q in states before the certain state.

In the configuration illustrated in FIG. 15, the capacitor life and the fan life calculated by the power conversion device 2 are transmitted to the machine learning device 310. However, the present embodiment is not limited to this configuration. For example, the capacitor life and the fan life may be calculated by the machine learning device 310.

Figure 16:
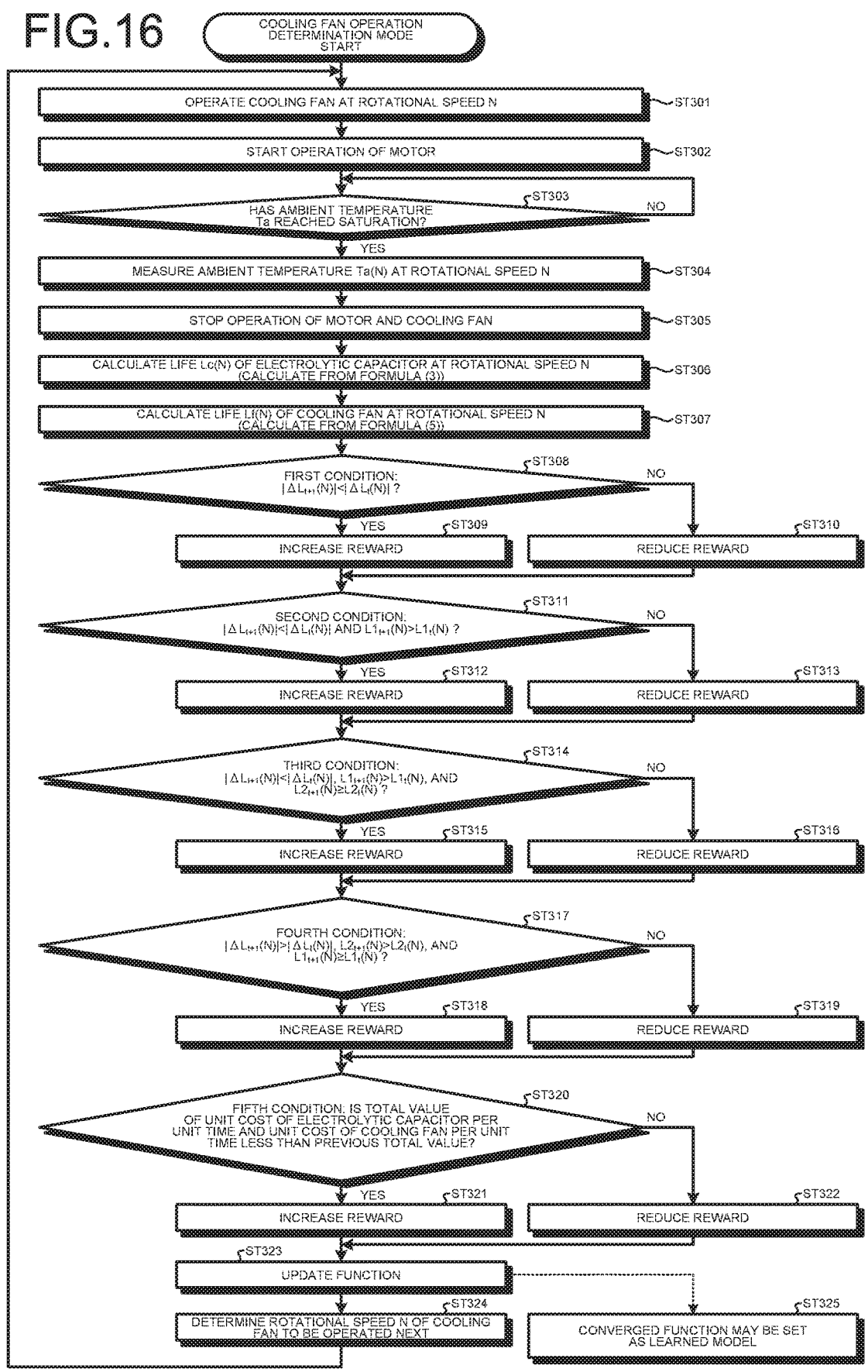
FIG. 16 is a flowchart illustrating an example of a process in the machine learning device according to the fourth embodiment.

Next, the operation of the machine learning device 310 according to the fourth embodiment will be described with reference to FIGS. 15 and 16. FIG. 16 is a flowchart illustrating an example of a learning process in the machine learning device 310 according to the fourth embodiment. FIG. 16 depicts a procedure for a cooling fan operation determination mode. The cooling fan operation determination mode is an operation mode in which the machine learning device 310 determines the rotational speed N of the cooling fan 8.

In the flowchart of FIG. 16, steps ST301 to ST307 are performed by the power conversion device 2.

In step ST301, the cooling fan 8 is operated at the rotational speed N. In step ST302, the operation of the motor 3 is started. In step ST303, it is determined based on the value detected by the temperature sensor 9a whether the ambient temperature Ta has reached saturation. Step ST303 is repeated until it is determined that the ambient temperature Ta has reached saturation. If it is determined that the ambient temperature Ta has reached saturation, the process proceeds to step ST304.

In step ST304, the ambient temperature Ta (N) in the case that the cooling fan 8 rotates at the rotational speed N is measured. In step ST305, the operation of the motor 3 and the cooling fan 8 is stopped.

In step ST306, the life Lc (N) of the electrolytic capacitor 5 in the case that the cooling fan 8 rotates at the rotational speed N is calculated. Formula (3) above is used to calculate the life Lc (N).

In step ST307, the life Lf (N) of the cooling fan 8 in the case that the cooling fan 8 rotates at the rotational speed N is calculated. Formula (5) above is used to calculate the life Lf (N).

Subsequent steps ST308 to ST325 are performed by the machine learning device 310. In the machine learning device 310, the reward r is given by the reward calculation unit 311a. In the following description, the operation of giving the reward r will be described in detail using five (first to fifth) conditions as an example. Note that the process based on the first condition is referred to as the "first process", the process based on the second condition is referred to as the "second process", the process based on the third condition is referred to as the "third process", the process based on the fourth condition is referred to as the "fourth process", and the process based on the fifth condition is referred to as the "fifth process".

In the description below, the following symbols are used.

ΔL (N): the difference between the life Lc (N) and the life Lf (N)

|ΔL (N)|: the absolute value of ΔL (N)

|ΔL$_t$ (N)|: |ΔL (N)| used in the previous process

|ΔL$_{t+1}$ (N)|: |ΔL (N)| that is used in the current process

L1 (N): the shorter one of the life Lc (N) and the life Lf (N)

L2 (N): the longer one of the life Lc (N) and the life Lf (N)

L1$_t$ (N): L1 (N) used in the previous process

L2$_t$ (N): L2 (N) used in the previous process

L1$_{t+1}$ (N): L1 (N) that is used in the current process

L2$_{t+1}$ (N): L2 (N) that is used in the current process

<First Process>

The first process is the process of determining whether to increase the reward r or reduce the reward r based only on |ΔL (N)|, which is the absolute value of the difference between the life Lc (N) and the life Lf (N). In FIG. 16, in step ST308, the determination process is performed based on the conditional expression |ΔL$_{t+1}$ (N)|<|ΔL$_t$ (N)| representing the first condition. Specifically, in step ST308, it is determined whether the absolute value of the difference between the life Lc (N) and the life Lf (N) has decreased. If the absolute value of the difference is less than the previous absolute value (step ST308, Yes), the process proceeds to step ST309. In step ST309, the reward r is increased. On the other hand, if the absolute value of the difference is greater than the previous absolute value (step ST308, No), the process proceeds to step ST310. In step ST310, the reward r is reduced. Note that either "Yes" or "No" may be selected if the absolute value of the difference is equal to the previous absolute value. That is, if the absolute value of the difference is equal to a threshold value, the reward r may be increased or the reward r may be reduced.

Instead of the determination process in step ST308, a determination process with a threshold value may be performed. Specifically, if the absolute value of the difference is less than the threshold value, the reward r is increased. On the other hand, if the absolute value of the difference is equal to or greater than the threshold value, the reward r is reduced. Note that if the absolute value of the difference is equal to the threshold value, either process may be performed. Specifically, if the absolute value of the difference is equal to the threshold value, the reward r may be increased or the reward r may be reduced.

<Second Process>

The second process is one of the processes for converging the life Lc (N) and the life Lf (N) to equivalence. In step ST311, the determination process is performed based on the conditional expressions |ΔL$_{t+1}$ (N)|<|ΔL$_t$ (N)| and L1$_{t+1}$ (N)>L1$_t$ (N) representing the second condition. Specifically, in step ST311, it is determined whether the absolute value of the difference has decreased and whether the shorter one of the life Lc (N) and the life Lf (N) is longer than the previous one. If the absolute value of the difference has decreased and the shorter one of the life Lc (N) and the life Lf (N) is longer than the previous one (step ST311, Yes), the process proceeds to step ST312. In step ST312, the reward r is increased. On the other hand, if the absolute value of the difference is equal to or greater than the previous absolute value or if the shorter one of the life Lc (N) and the life Lf (N) is not longer than the previous one (step ST311, No), the process proceeds to step ST313. In step ST313, the reward r is reduced. Note that either "Yes" or "No" may be selected if the absolute value of the difference is equal to the previous absolute value. That is, if the absolute value of the difference is equal to a threshold value, the reward r may be increased or the reward r may be reduced.

<Third Process>

The third process is one of the processes for converging the life Lc (N) and the life Lf (N) to equivalence, which is different from the second process. In step ST314, the determination process is performed based on the conditional expressions |ΔL$_{t+1}$ (N)|<|ΔL$_t$ (N)|, L1$_{t+1}$ (N)>L1$_t$ (N), and L2$_{t+1}$ (N)≥L2$_t$ (N) representing the third condition. Specifically, in step ST314, it is determined whether the absolute value of the difference has decreased, whether the shorter one of the life Lc (N) and the life Lf (N) is longer than the previous one, and whether the longer one of the life Lc (N) and the life Lf (N) is longer than or equal to the previous one. If the absolute value of the difference has decreased, if the shorter one of the life Lc (N) and the life Lf (N) is longer than the previous one, and if the longer one of the life Lc (N) and the life Lf (N) is longer than or equal to the previous one (step ST314, Yes), the process proceeds to step ST315. Note that the case in which the longer one of the life Lc (N) and the life Lf (N) is longer than or equal to the previous one means that the longer one of the life Lc (N) and the life Lf (N) is not shorter than the previous one. In step ST315, the reward r is increased. On the other hand, if the absolute value of the difference is equal to or greater than the previous absolute value, if the shorter one of the life Lc (N) and the life Lf (N) is not longer than the previous one, or if the longer one of the life Lc (N) and the life Lf (N) is shorter than the previous one (step ST314, No), the process proceeds to step ST316. In step ST316, the reward r is reduced. Note that either "Yes" or "No" may be selected if the absolute value of the difference is equal to the previous absolute value. That is, if the absolute value of the difference is equal to a threshold value, the reward r may be increased or the reward r may be reduced.

In the determination process of step ST314, the life Lc (N) of the electrolytic capacitor 5 can be longer than the life Lf (N) of the cooling fan 8, or the life Lc (N) of the electrolytic capacitor 5 can be shorter than the life Lf (N) of the cooling fan 8. Here, the case in which the life Lc (N) of the electrolytic capacitor 5 is longer than the life Lf (N) of the cooling fan 8 will be described as an exemplary case in which the third process works effectively.

In the third process, the process of increasing the reward r is performed if the shorter one of the life Lc (N) and the life Lf (N), namely Lf (N), has been extended and the longer one of the life Lc (N) and the life Lf (N), namely Lc (N), has not been shortened. Such a process is performed in a case where the cooling fan 8 is unnecessarily operated and the life Lc (N) of the electrolytic capacitor 5 changes very little when the rotational speed N of the cooling fan 8 is lowered. Therefore, the third process works effectively when the life Lc (N) of the electrolytic capacitor 5 is longer than the life Lf (N) of the cooling fan 8.

<Fourth Process>

The fourth process is one of the processes for converging the life Lc (N) and the life Lf (N) to equivalence, which is different from the second and third processes. In step ST317, the determination process is performed based on the conditional expressions $|\Delta L_{t+1}(N)| > |\Delta L_t(N)|$, $L2_{t+1}(N) > L2_t(N)$, and $L1_{t+1}(N) \geq L1_t(N)$ representing the fourth condition. Specifically, in step ST317, it is determined whether the absolute value of the difference has increased, whether the longer one of the life Lc (N) and the life Lf (N) has been extended, and whether the shorter one of the life Lc (N) and the life Lf (N) has been extended or maintained. If the absolute value of the difference has increased, if the longer one of the life Lc (N) and the life Lf (N) has been extended, and if the shorter one of the life Lc (N) and the life Lf (N) has been extended or maintained (step ST317, Yes), the process proceeds to step ST318. Note that the case in which the shorter one of the life Lc (N) and the life Lf (N) has been extended or maintained means that the shorter one of the life Lc (N) and the life Lf (N) has not been shortened. In step ST318, the reward r is increased. On the other hand, if the absolute value of the difference is equal to or less than the previous absolute value, if the longer one of the life Lc (N) and the life Lf (N) has not been extended, or if the shorter one of the life Lc (N) and the life Lf (N) has been shortened (step ST317, No), the process proceeds to step ST319. In step ST319, the reward r is reduced. Note that either "Yes" or "No" may be selected if the absolute value of the difference is equal to the previous absolute value. That is, if the absolute value of the difference is equal to a threshold value, the reward r may be increased or the reward r may be reduced.

As described above, in the determination process of step ST317, the life Lc (N) of the electrolytic capacitor 5 can be longer than the life Lf (N) of the cooling fan 8, or the life Lc (N) of the electrolytic capacitor 5 can be shorter than the life Lf (N) of the cooling fan 8. Here, the case in which the life Lc (N) of the electrolytic capacitor 5 is shorter than the life Lf (N) of the cooling fan 8 will be described as an exemplary case in which the fourth process works effectively.

In the fourth process, the process of increasing the reward r is performed if the longer one of the life Lc (N) and the life Lf (N), namely Lf (N), has been extended and the shorter one of the life Lc (N) and the life Lf (N), namely Lc (N), has not been shortened. Such a process is performed in a case where the cooling fan 8 is unnecessarily operated and the life Lc (N) of the electrolytic capacitor 5 changes very little when the rotational speed N of the cooling fan 8 is lowered. Therefore, the fourth process works effectively when the life Lc (N) of the electrolytic capacitor 5 is shorter than the life Lf (N) of the cooling fan 8.

<Fifth Process>

The fifth process is the process of determining whether to increase the reward r or reduce the reward r in consideration of the costs of the electrolytic capacitor 5 and the cooling fan 8. In FIG. 16, in step ST320, it is determined whether the fifth condition is satisfied, that is, whether the total value of the unit cost of the electrolytic capacitor 5 per unit time and the unit cost of the cooling fan 8 per unit time is less than the total value obtained in the previous determination. Here, the unit cost of the electrolytic capacitor 5 per unit time is a value standardized by the life Lc (N) at the time of determination, and the unit cost of the cooling fan 8 per unit time is a value standardized by the life Lf (N) at the time of determination. The unit cost of the electrolytic capacitor 5 may include, in addition to the price of the electrolytic capacitor 5, at least one of the replacement cost and the maintenance cost. The unit cost of the cooling fan 8 may include, in addition to the price of the cooling fan 8, at least one of the replacement cost and the maintenance cost. If the total value is less than the total value obtained in the previous determination (step ST320, Yes), the process proceeds to step ST321. In step ST321, the reward r is increased. On the other hand, if the total value is greater than the total value obtained in the previous determination (step ST320, No), the process proceeds to step ST322. In step ST322, the reward r is reduced. Note that either "Yes" or "No" may be selected if the total value is equal to the total value obtained in the previous determination. That is, if the total value is equal to the total value obtained in the previous determination, the reward r may be increased or the reward r may be reduced.

In step ST323, the function for determining the rotational speed N of the cooling fan 8 is updated. Specifically, the function update unit 311b updates the function for determining the rotational speed N of the cooling fan 8 in accordance with the reward r calculated by the reward calculation unit 311a. For example, in the case of Q-learning, the action value function $Q(s_t, a_t)$ represented by Formula (11) above is used as the function for determining the rotational speed N of the cooling fan 8. Note that if the action value function $Q(s_t, a_t)$ converges in step ST323, the action value function $Q(s_t, a_t)$ may be set as a learned model as indicated in step ST325. The converged action value function $Q(s_t, a_t)$ can be used as a learned model in another device or the like.

In step ST324, the rotational speed N of the cooling fan 8 to be operated next is determined. For example, in the case of Q-learning, the function update unit 311b computes the action $a_t$, i.e. the rotational speed N of the cooling fan 8, that maximizes the action value Q determined by the action value function $Q(s_t, a_t)$ in the current state $s_t$ in the learning process, and feeds back the action $a_t$ to the power conversion device 2. Note that the action $a_t$ can be selected simply by using a well-known technique such as the s-greedy method. Thereafter, the process returns to step ST301, and steps ST301 to ST324 are repeated. On the other hand, if the action value function Q ($s_t$, $a_t$) converges, the function update unit 311b selects the rotational speed N of the cooling fan 8 that maximizes the action value Q determined by the converged action value function Q ($s_t$, $a_t$), and ends the cooling fan operation determination mode. The power conversion device 2 controls the rotational speed N of the cooling fan 8 based on the rotational speed N of the cooling fan 8 fed back from the function update unit 311b.

Figure 17:
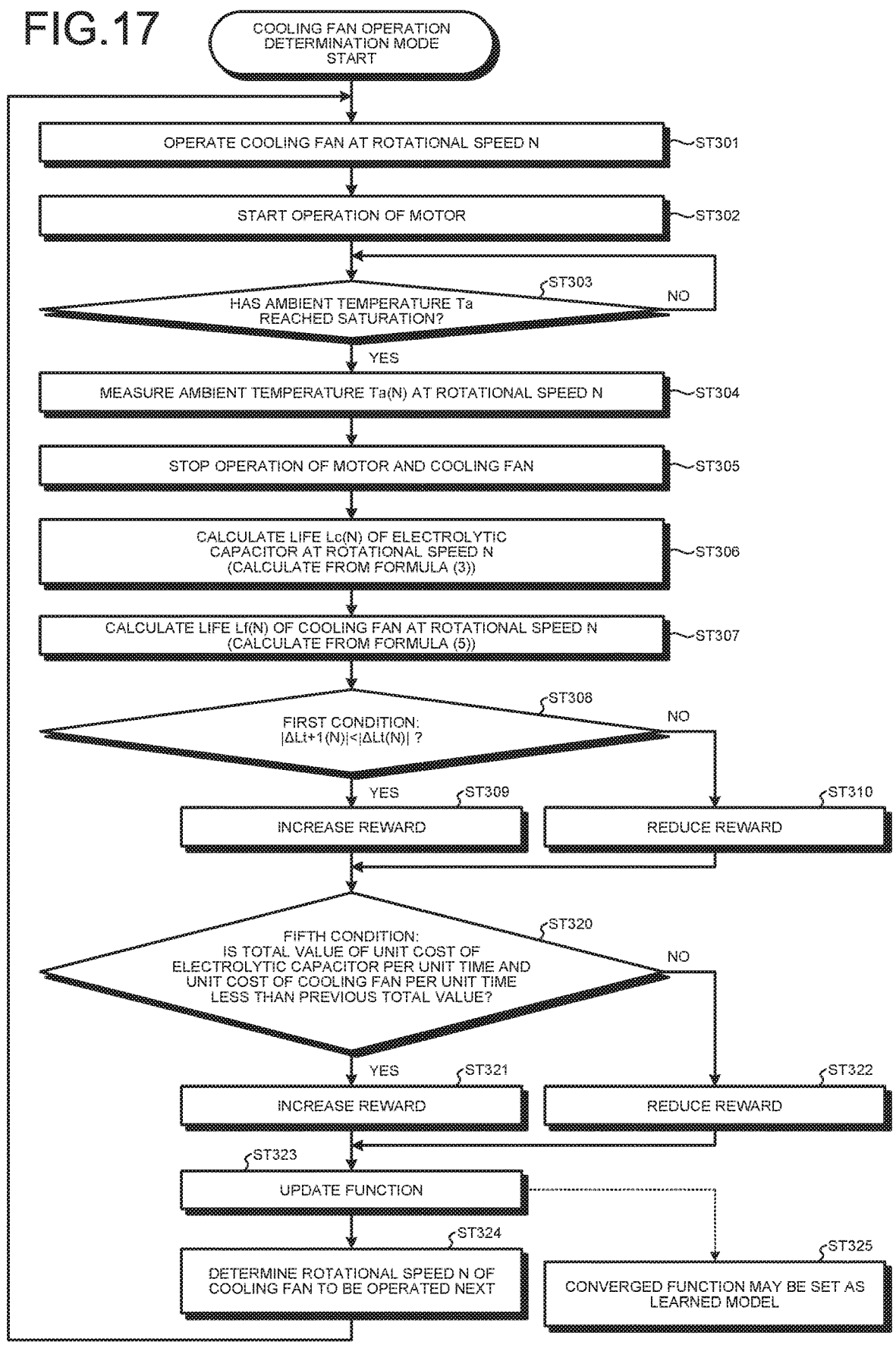
FIG. 17 is a flowchart illustrating another example of a process in the machine learning device according to the fourth embodiment.

Note that the procedure of FIG. 16 described above includes all of the first to fifth processes based on the five (first to fifth) conditions. Among these processes, the fifth process can be optionally selected as a supplement to the first to fourth processes. At least one of the first to third processes should be included. The fourth process can be optionally selected as a supplement to at least one of the first to third processes. Hereinafter, the procedure including the first and fifth processes will be described as an example with reference to FIG. 17. That is, FIG. 17 is a flowchart illustrating another example of a learning process in the machine learning device 310 according to the fourth embodiment. Note that some steps in FIG. 17 are the same as and thus denoted by the same reference signs as those in FIG. 16.

In FIG. 17, steps ST301 to ST307 are as described above, and descriptions thereof are omitted here.

In FIG. 17, the machine learning device 310 performs the determination process based on the conditional expression $|\Delta L_{t+1} (N)| < |\Delta L_t (N)|$ representing the first condition (step ST308). The machine learning device 310 determines whether the absolute value of the difference between the life Lc (N) and the life Lf (N) has decreased. If the absolute value of the difference is less than the previous absolute value (step ST308, Yes), the machine learning device 310 increases the reward r (step ST309). On the other hand, if the absolute value of the difference is greater than the previous absolute value (step ST308, No), the machine learning device 310 reduces the reward r (step ST310).

Next, the machine learning device 310 determines whether the total value of the unit cost of the electrolytic capacitor 5 per unit time and the unit cost of the cooling fan 8 per unit time is less than the total value obtained in the previous determination (step ST320). If the total value is less than the total value obtained in the previous determination (step ST320, Yes), the machine learning device 310 increases the reward r (step ST321). On the other hand, if the total value is greater than the total value obtained in the previous determination (step ST320, No), the machine learning device 310 reduces the reward r (step ST322).

Note that different designers or users of the machine learning device 310 place importance on different conditions. Therefore, the reward in step ST309 and the reward in step ST321 may be increased by different amounts according to the designer or user's request. The same applies to the reward reduced in step ST310 and the reward reduced in step ST322. In addition, since different designers or users of the machine learning device 310 place importance on different conditions, the reward in step ST309 and the reward in step ST310 may be increased and reduced, respectively, by different amounts according to the designer or user's request. The same applies to the reward increased in step ST321 and the reward reduced in step ST322.

The machine learning device 310 updates the function for determining the rotational speed N of the cooling fan 8 according to the calculated reward r (step ST323). The machine learning device 310 determines the rotational speed N of the cooling fan 8 to be operated next (step ST324). Thereafter, the process returns to step ST301, and the above-described steps are repeated. If the function converges, the converged function is set as a learned model (step ST325).

Information on the rotational speed N of the cooling fan 8 learned by the machine learning device 310 is fed back to the power conversion device 2. The power conversion device 2 controls the rotational speed N of the cooling fan 8 based on the rotational speed N of the cooling fan 8 fed back from the machine learning device 310.

In the above embodiment, machine learning is performed using reinforcement learning. Alternatively, machine learning may be performed using other well-known methods such as supervised learning and unsupervised learning. Examples of well-known methods can include neural networks, genetic programming, functional logic programming, and support vector machines.

As described above, the machine learning device according to the fourth embodiment observes the life of the cooling fan 8 that is the first component and the life of the electrolytic capacitor 5 that is the second component whose life varies according to the drive amount of the cooling fan 8, and learns a drive condition, namely the rotational speed N, based on the life of the cooling fan 8 and the life of the electrolytic capacitor 5. Therefore, the life of the cooling fan 8 and the life of a component such as the electrolytic capacitor 5 can be easily and accurately controlled according to the ambient temperature.

Note that the configurations described in the abovementioned embodiments indicate examples of the contents of the present invention. The configurations can be combined with another well-known technique, and some of the configurations can be omitted or changed in a range not departing from the gist of the present invention.

REFERENCE SIGNS LIST

1 AC power source; 2, 2A power conversion device; 3 motor; 4 rectifier circuit; 5 electrolytic capacitor; 6 power module; 7 heat sink; 8 cooling fan; 9a temperature sensor (first temperature sensor); 9b temperature sensor (second temperature sensor); 10, 10A cooling fan control unit; 11 operation panel; 12 electrolytic capacitor life storage unit; 13 cooling fan life storage unit; 14 operation time measurement unit; 15 coefficient deriving unit; 16 cooling fan operation determination unit; 21 junction temperature estimation unit; 22 current sensor; 100 server; 101 information processing device; 103 PLC; 105 communication network; 200 CPU; 202 memory; 203 processing circuit; 204 interface; 300 edge device; 310 machine learning device; 311 learning unit; 311a reward calculation unit; 311b function update unit; 312 state observing unit.

The invention claimed is:

1. An electronic device comprising:
a first component;
a control circuitry to control a drive amount of the first component; and
a second component whose life varies according to the drive amount of the first component, wherein
the control circuitry controls the drive amount based on a relationship between the drive amount, a life of the first component, and the life of the second component, and
the control circuitry controls the drive amount to make a shorter one of the life of the first component and the life of the second component longer than a shorter one of the life of the first component and the life of the second component before the drive amount of the first component is changed.

2. The electronic device according to claim 1, wherein the electronic device is a power conversion device.

3. The electronic device according to claim 2, wherein the first component is a cooling fan.

4. The electronic device according to claim 2, wherein the control circuitry controls the drive amount to make both the life of the first component and the life of the second component longer than a shorter one of the life of the first component and the life of the second component in a case that the first component is driven according to a rating.

5. The electronic device according to claim 2, wherein the control circuitry includes a coefficient deriving circuitry to calculate the relationship between the drive amount, the life of the first component, and the life of the second component from a relationship between the drive amount of the first component and a temperature of an area around the first component.

6. The electronic device according to claim 2, further comprising
a power module equipped with a semiconductor chip, wherein
based on a relationship between a junction temperature in a joint region of the semiconductor chip and the drive amount, the control circuitry controls the drive amount such that the junction temperature does not exceed a specified temperature.

7. A control system for a power conversion device, the control system comprising:
a power conversion device including a first component and a second component whose life varies according to a drive amount of the first component; and
an information processing circuitry connected to the power conversion device and including a control circuitry to control the drive amount, wherein
the control circuitry controls the drive amount based on a relationship between the drive amount, a life of the first component, and the life of the second component, and
the control circuitry controls the drive amount to make a shorter one of the life of the first component and the life of the second component longer than a shorter one of the life of the first component and the life of the second component before the drive amount of the first component is changed.

8. The control system for a power conversion device according to claim 7, wherein the control circuitry includes a coefficient deriving circuitry to calculate the relationship between the drive amount, the life of the first component, and the life of the second component from a relationship between the drive amount of the first component and a temperature of an area around the first component.

9. The control system for a power conversion device according to claim 7, wherein the information processing circuitry controls the drive amount in a plurality of the power conversion devices.

10. The control system for a power conversion device according to claim 7, wherein
the information processing circuitry is connected to a cloud server, and
the information processing circuitry controls the drive amount based on information about the first component or the second component on the cloud server.

11. A method of controlling a cooling fan in a power conversion device, the power conversion device including: a cooling fan; one or more sensors including a first temperature sensor to measure an ambient temperature; a control circuitry to receive a temperature measured by the first temperature sensor to control a rotational speed of the cooling fan; and a component whose life varies according to the rotational speed, the method comprising:
obtaining a first relationship between the rotational speed of the cooling fan obtained by the control circuitry and the temperature measured by the first temperature sensor;
obtaining a second relationship between the temperature measured by the first temperature sensor and the life of the component;
obtaining a third relationship between the rotational speed of the cooling fan and the life of the component from calculation results of the first relationship and the second relationship; and
obtaining a fourth relationship between the rotational speed of the cooling fan and the life of the cooling fan from calculation results of the first relationship; and
controlling, based on a relationship between the rotational speed, a life of the cooling fan, and the life of the component, the rotational speed to make a shorter one of the life of the cooling fan and the life of the component longer than a shorter one of the life of the cooling fan and the life of the component before the rotational speed of the cooling fan is changed.

12. The method of controlling a cooling fan according to claim 11, wherein
in determining the rotational speed of the cooling fan, the rotational speed is determined to make both a life of the cooling fan and the life of the component longer than a shorter one of the life of the cooling fan and the life of the component in a case that the cooling fan is driven according to a rating.

13. A machine learning device for learning a drive condition for a first component in a power conversion device, the machine learning device comprising:
a state observing circuitry to observe a life of the first component and a life of a second component that varies according to a drive amount of the first component; and
a learning circuitry to learn the drive condition based on the life of the first component and the life of the second component, wherein
the learning circuitry learns the drive condition that maximizes a value calculated with a function for determining the drive condition to make a shorter one of the life of the first component and the life of the second component longer than a shorter one of the life of the first component and the life of the second component before the drive amount of the first component is changed.

14. The machine learning device according to claim 13, wherein
the learning circuitry includes:
a reward calculation circuitry to calculate a reward based on the life of the first component and the life of the second component; and
a function update circuitry to update a function for determining the drive condition based on the reward calculated.

15. The machine learning device according to claim 14, wherein the reward calculation circuitry increases the reward if an absolute value of a difference between the life of the first component and the life of the second component is equal to or less than a threshold value, or the reward calculation circuitry increases the reward if an absolute value of a difference between the life of the first component and the life of the second component is less than a previous absolute value.

16. The machine learning device according to claim 15, wherein the reward calculation circuitry increases the reward if a shorter one of the life of the first component and the life of the second component is longer than a previous one.

17. The machine learning device according to claim 16, wherein the reward calculation circuitry increases the reward if a longer one of the life of the first component and the life of the second component is not shorter than a previous one.

18. The machine learning device according to claim 15, wherein the reward calculation circuitry increases the reward if the absolute value of the difference between the life of the first component and the life of the second component is greater than the threshold value or greater than the previous absolute value, if a longer one of the life of the first component and the life of the second component is longer than a previous one, and if a shorter one of the life of the first component and the life of the second component is not shorter than a previous one.

19. The machine learning device according to claim 15, wherein the reward calculation circuitry increases the reward if a total value of a price of the first component per unit time and a price of the second component per unit time is less than a previous total value, the price of the first component per unit time being obtained by standardizing a price of the first component by the life of the first component, the price of the second component per unit time being obtained by standardizing a price of the second component by the life of the second component.

* * * * *